United States Patent [19]

Tanaka et al.

[11] Patent Number: 5,446,690
[45] Date of Patent: Aug. 29, 1995

[54] SEMICONDUCTOR NONVOLATILE MEMORY DEVICE

[75] Inventors: Toshihiro Tanaka, Akigawa; Masataka Kato, Musashino; Toshio Sasaki, Nishitama; Hitoshi Kume, Musashino; Hiroaki Kotani, Ome; Kazunori Furusawa, Kodaira, all of Japan

[73] Assignee: Hitachi, Ltd., Tokyo, Japan

[21] Appl. No.: 249,383

[22] Filed: May 25, 1994

[30] Foreign Application Priority Data

Aug. 10, 1993 [JP] Japan .................................. 5-198180

[51] Int. Cl.6 .............................................. G11C 11/34
[52] U.S. Cl. ................................. 365/185; 365/189.05; 365/189.07; 365/203
[58] Field of Search ............ 365/184, 185, 201, 189.05, 365/189.07, 203; 371/21.2, 21.4, 40.1, 40.4

[56] References Cited

U.S. PATENT DOCUMENTS 5,172,338 12/1992 Mehrotra et al. .................... 365/185

OTHER PUBLICATIONS

T. Tanaka et al., "A Quick Intelligent Program Architecture for 3V—only NAND-EEPROMs", 1992 Symposium on VLSI Circuits Digest of Technical Papers, pp. 20-21, (1992).

Primary Examiner—Joseph A. Popek

[57] ABSTRACT

A semiconductor nonvolatile memory device in which the states of memory cells are determined with respect to each of all data lines in a nonvolatile memory device so as to perform control such as continuation and suspension of programming automatically. Memory cell arrays in which nonvolatile semiconductor memory cells are arranged in an array form, word lines W1 and W2 to which control gates of a plurality of memory cell groups (sectors) are connected in common and data lines to which drains of a plurality of memory cells are connected in common are included, and there are possessed of a precharging circuit, a data hold circuit having a sense amplifier function and a data latch function and a memory cell state detecting circuit for each of said data lines. Reprogramming is made at the same time with respect to memory cells (sector) connected to the same word line. During reprogramming operation, the state of memory cells is read out at the same time with all of the data lines, and continuation and suspension of the reprogramming operation are controlled in the device only based on the information.

16 Claims, 19 Drawing Sheets

FIG. 18

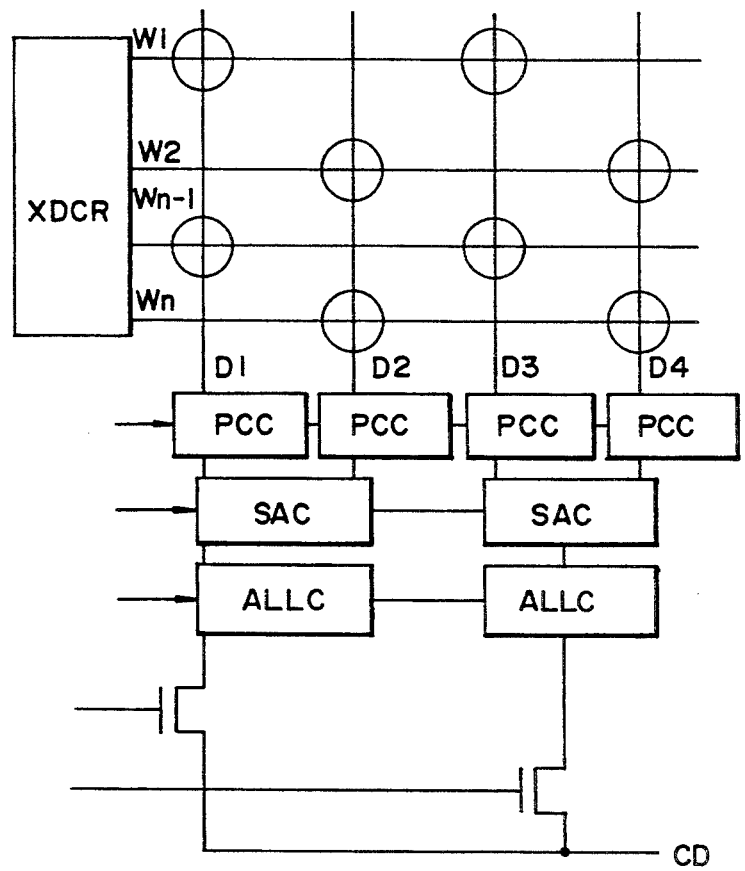

FIG. 19

| DEFINITION OF PROGRAMMING OPERATION | | PROGRAMMING TECHNIQUES | REMARKS |
|---|---|---|---|
| PROGRAMMING THRESHOLD VALUE | DRAIN VOLTAGE | | |
| a | PARTIALLY MADE HIGH SELECTIVELY FROM LOW STATE AFTER ERASE | SELECTED 0V  UNSELECTED POSITIVE VOLTAGE | VERIFY SYSTEM | NAND-EEPROM DEFINITION |
| b | PARTIALLY MADE LOW SELECTIVELY FROM HIGH STATE AFTER ERASE | SELECTED POSITIVE VOLTAGE  UNSELECTED 0V | PRECHARGING SYSTEM | PRESENT INVENTION DEFINITION |

| PROGRAM DATA (LATCHED DATA) | 0 | 0 | 1 | 1 |
|---|---|---|---|---|
| CELL DATA | 0 | 1 | 0 | 1 |
| PROGRAM DATA (RE-LATCHED DATA) | 0 | 0 | 1 | 0 |

SEMICONDUCTOR NONVOLATILE MEMORY DEVICE

BACKGROUND OF THE INVENTION AND SUMMARY OF THE INVENTION

The present invention relates to an electrically programmable and erasable semiconductor nonvolatile memory device, and more particularly to a semiconductor nonvolatile memory device in which it is arranged so that continuation and suspension of the programming and program-verify sequence performed at time of reprogramming can be detected and controlled automatically in the memory device, thus making it possible to make reprogramming operation and program-verify operation high in speed and to miniaturize the device thereof.

A reprogramming circuit structure of a NAND-EEPROM system has been heretofore proposed in Symposium on VLSI Circuits Digest of Technical Papers pp. 20–21 1992 as a method of electrically reprogramming data of a plurality of nonvolatile semiconductor memory elements (memory cells) control gates of which are connected to the same word line at the same time. FIG. 22, FIG. 23 and FIG. 24 are for explaining the conventional example described above.

FIG. 22 shows a reprogramming circuit structure of a conventional NAND-EEPROM. Two gate input terminals of a read/write circuit are connected to data lines BLai and BLbi of different memory arrays through verify circuits. The read/write circuit is composed of a flip-flop type, and this circuit acts as a differential sense circuit at time of program-verify operation and acts as a data latch circuit at time of programming operation.

When data are loaded at the same time in a plurality of memory cells on word lines, threshold voltages of individual memory cells have to be arranged within a certain predetermined positive voltage range. So, the threshold voltages of the memory cells on the word line are read out (verify operation) after performing programming operation, thus determining whether the threshold voltages are within a predetermined positive range with respect to all memory cells in which programming is made. When the threshold voltage is out of the range, programming operation has been repeated until the threshold voltage is reinstated in the range.

In the NAND-EEPROM, the threshold voltage of the memory cell shows a low voltage state (a negative threshold voltage) by erase operation and shows a high voltage state (a positive threshold voltage) by programming operation. The programming operation is performed by applying 18V to a selected word line, applying 0V to a data line with respect to the memory cell to which programming is made (selected) and applying 8V to the data line with respect to the memory cell in which programming is not made (unselected). Besides, the loaded data are held in a latch in the read/write circuit, and 8V for the unselected data line is obtained by boosting the voltage of a terminal Vrw of the read/write circuit up to 8V.

After completing programming described above, program-verify is made using a verify circuit. A signal timing waveform diagram at time of program-verify operation is shown in FIG. 23. Now, when a cell on the side of the memory cell array (a) has been selected, the voltage of the bit lines BLai is precharged by $\phi$pa up to voltage Va=(3/5) Vcc, i.e., 1.8V. On the other hand, the voltage of the dummy bit lines of the bit lines BLbi is precharged by $\phi$pb up to Vb=($\frac{1}{2}$) Vcc, i.e., 1.5V (t1 to t2).

After the bit lines are precharged, the voltage of the selected word line (CG) is dropped down to the program-verify voltage 0.6V, and Vcc is applied to the unselected word line (CG). In case the threshold voltage of the selected memory cell is at 0.6V or below, an electric current flows in the selected memory cell, and the voltage of the bit line shows 1.5V or below. On the other hand, when the threshold voltage of the memory cell is higher than 0.6V, no electric current flows, and the voltage of the bit lines is maintained at the precharge voltage of 1.8V (t2 to t3).

When all word lines (CG) are brought into an unselected state thereafter, a verify circuit signal $\phi$av shows an active state (Vcc). When latched data of the read/write circuit show "1" (voltage value 0V), a MOS transistor T1 is turned OFF, and the voltage of the bit lines BLai is maintained at a level before $\phi$av is brought into an active state. On the other hand, when the latch data show "0" (voltage value Vcc), the MOS transistor T1 is turned ON, and the voltage of the bit lines BLai shows 1.5V or higher (t3 to t4).

When the verify circuit signal $\phi$av turns low (Vss), the read/write circuit is brought into an equalized state ($\phi$p: high, $\phi$n: low, $\phi$e: high), and it is operated thereafter as a data hold circuit by activation of the verify circuit signals $\phi$a and $\phi$b (t4 and thereafter).

The voltage of the bit lines BLai is read by an open-bit line architecture, and read-out (program-verify) data after programming thereof are reprogrammed into the latch data of the read/write circuit. The relationship among programmed data, reprogrammed data and data of memory cells is shown in FIG. 24.

Now, when a certain memory cell is applied with "1" (latch data voltage 0V) programming and the threshold voltage of the memory cell reaches a value of 0.6V or higher in program-verify operation, the latch data voltage is applied with Vcc, i.e., "0" programming in order to prevent over programming of the memory cell.

In the prior art described above, the programming and program-verify sequence has been controlled for each bit of a reprogrammed sector. Since detection and determination on whether programming for all bits for which programming has been selected has been completed or not are not made, however, it has been unable to determine suspension of programming and program-verify sequence. Therefore, in the prior art, for example, sufficient programming time has been set using a self-contained timer and programming operation and program-verify operation have been repeated in the set programming period of time. As a result, it has been required to set over programming period of time including a margin with respect to the programming period of time required for loading data in the memory cells.

Further, when the detection and determination operation on termination of programming is made to be executed by a CPU in a system located outside a semiconductor nonvolatile memory device (for example, a portable system such as an automatically controlled camera system, a portable recorder and a pocket computer), it is required to have buses between the semiconductor nonvolatile memory device and the system always kept connected in order to transfer the memory cell data in the semiconductor nonvolatile memory device to the CPU. Thus, there has been such a problem that the CPU is occupied by reprogramming control of the semiconductor volatile memory device at time of loading data.

It is a first object of the present invention to solve the above-mentioned problems and to provide a semiconductor nonvolatile memory device capable of executing electrical programming and erasing of sector information while keeping the buses between the semiconductor nonvolatile memory device and the system separated.

Further, the prior art described above has been effective only when (1) the threshold voltages of the memory cells are brought to a high voltage state selectively from a low voltage state after erase by programming operation and (2) 0V is applied to programming-selected drain lines and positive voltage is applied to unselected drain lines as shown at a in FIG. 19. However, when (1) the threshold voltages of the memory cells are brought to a low voltage state selectively from a high voltage state after erase by programming operation and (2) positive voltage is applied to programming-selected drain lines and 0V is applied unselected drain lines at programming time as shown at b in FIG. 19, it has been impossible to control continuation and suspension of programming of memory cells.

The reason thereof will be explained with reference to FIG. 20. FIG. 20 shows the state of memory cells on the word line on the way of programming and program-verify sequence.

Now, it is assumed that the threshold voltages of memory cells connected to data lines b1 and b2 are in a high voltage state and the threshold voltages of memory cells connected to data lines b3 and b4 are in a low voltage state. Those data that are desired to be loaded in respective memory cells are shown as initial loaded data. Since the memory cell connected to the data line b2 has a high threshold voltage in the present state, it is required to repeat programming further. Since the memory cell of a data line b4 has a low threshold voltage, programming operation from the next time is suspended.

In the verify system which is a conventional system, all data lines are precharged regardless of the latch data of a data hold circuit corresponding to the read/write circuit shown in FIG. 22. Then, when read voltage is applied to the word lines, voltages the data lines b3 and b4 having the memory cells of a low threshold voltage become 0V. Since the latch data of the data hold circuit are reloaded by using this state of the data lines, and thereafter, data lines are charged in accordance with the latched data, the data lines b2 and b4 and the data line b1 holding precharge voltage show 3V by initial loaded data of the data hold circuit. Thus, reloaded data become different in the data line b4 desirous to suspend reprogramming and the data line b1 desirous to hold initial loaded data 0V. Namely, it is impossible to use the verify system which is a conventional system for a memory system shown at b in FIG. 19.

It is a second object of the present invention to determine continuation and suspension of the programming and program-verify sequence with respect to each data line and to determine the fact that programming of all memory cells which become objects of programming has been completed in the interior of a semiconductor nonvolatile memory device in the semiconductor nonvolatile memory device when a programming threshold voltage of a semiconductor nonvolatile memory element (memory cell) is brought to a low voltage state selectively from a high voltage state after erase by programming operation, and the selected drain line is made to show positive voltage and the unselected drain line voltage is made to show 0V at time of programming.

In order to achieve the above-mentioned object, the present invention has a structure shown hereunder.

Namely, nonvolatile semiconductor memory cells each having a control gate, a floating gate, a drain and a source are arranged in an array form, a plurality of memory cells in which control gates are connected in common by means of a word line are formed as a sector, the drains of memory cells in the sector are connected to different data lines, at least a precharging circuit, a state detecting circuit and a data hold circuit are provided for each data line, the word line is connected to a row address decoder, and the precharging circuit and the state detecting circuit are connected to a control signal generating circuit.

In the semiconductor nonvolatile memory device of the present invention, at least one word line is selected by a row address decoder and positive voltage is applied thereto, thereby to perform electrical erase at the same time for a plurality of memory cells in which the control gates are connected to the word line. Further, after the data which are to be loaded in the memory cells are transferred to the data hold circuit provided along each data line, negative voltage is applied to the selected word line using the row address decoder, and the voltage in accordance with the data in the data hold circuit is applied to the data line, thereby to perform programming operation. Namely, collective electrical erase and programming for the sector with the word line described above as a unit are possible. After programming operation described above, the operation of reading out the states of the memory cells in the sector at the same time (collective verify) is performed by applying voltage to the data lines selectively through the precharging circuit in accordance with the data in the data hold circuit, and following to the verify described above, the data in the data hold circuit corresponding to the memory cells in the sector are detected at the same time (state detecting operation) using the state detecting circuit, and the programming operation, the collective verify operation and the state detecting operation are continued until loading to the memory cells is completed.

BRIEF DESCRIPTION OF THE DRAWINGS

FIG. 18 is a block diagram of a sixth mat of the present invention;

FIG. 19 is a table for explaining the definition of programming operation and programming techniques;

DESCRIPTION OF THE PREFERRED EMBODIMENTS

Figure 1:
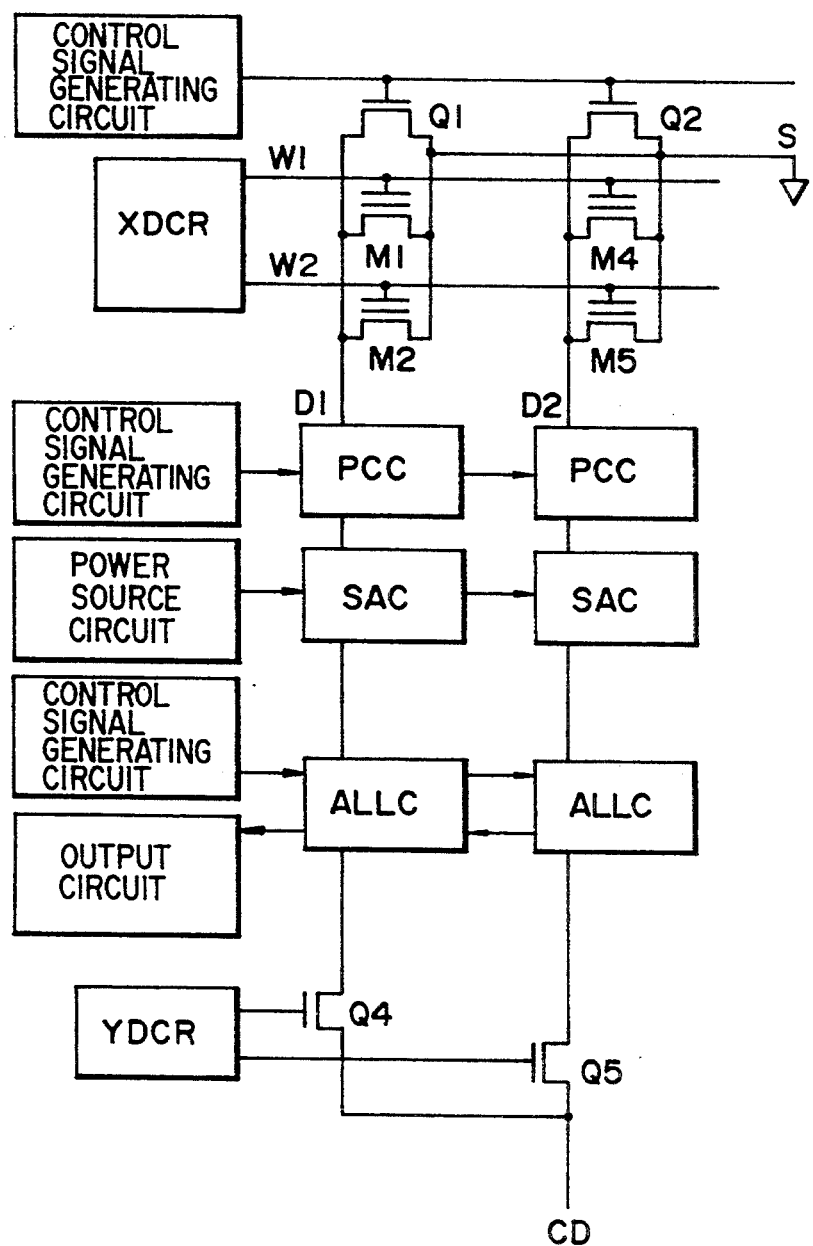
FIG. 1 is a block diagram of the present invention.

FIG. 1 shows a block diagram of a circuit which is an embodiment of a semiconductor nonvolatile memory device of the present invention. Nonvolatile memory cells M1, M2, M4 and M5 are publicly known nonvolatile memory cells (flash memory cells) electrically erasable at the same time. Control-gate electrodes of the memory cells M1 and M4 are connected to a word line W1, and control-gate electrodes of the memory cells M2 and M5 are connected to a word line W2. Furthermore, the word lines W1 and W2 are connected to a row decoder XDCR. Further, drain electrodes of the memory cells M1 and M2 are connected to a data line D1, and drain electrodes of the memory cells M4 and M5 are connected to a data line D2. Further, a precharge control circuit PCC for controlling data line voltage, a sense amplifier circuit SAC which acts as a data hold circuit for data sense functions and loaded data, and a memory cell state detecting circuit ALLC for determining the state of the data hold circuit are connected to each of the data lines D1 and D2, and further, column gates Q4 and Q5 are connected thereto. Further, respective data lines D1 and D2 are connected to data line discharge gates Q1 and Q2, respectively. Source electrodes of the memory cells M1 to M5 are connected to a common source line S and to ground (substrate voltage Vss).

The precharge control circuit PCC is composed of a MOSFET with at least a precharging signal as a gate input, a MOSFET with a terminal signal in the sense amplifier circuit SAC as a gate input and the like.

The memory cell described above is not limited particularly, but may be of a structure similar to a memory cell of an Erasable Programmable Read Only Memory (EPROM). However, the reprogramming method thereof is different from the method for a conventional EPROM using ultraviolet rays in a point that the reprogramming operation thereof is performed electrically by utilizing tunnel phenomena between a floating gate and a substrate, between drains coupled with the data lines or between sources coupled with the source line, or hot electron injection applying high voltage to the control-gate and the drain. The definition of programming operation of the memory cell is shown hereinafter at b in FIG. 19. The operation for making the threshold voltage of the memory cell higher than that in a thermally equilibrium state is defined as an erase operation, and the operation for lowering the threshold voltage to approximately that in a thermally equilibrium state is defined as a programming operation.

Positive high voltage is applied selectively to the word lines in the erase operation. The drain, source and channel voltages are set to the substrate voltage Vss. In an erased memory cell, electrons are accumulated in the floating gate thereof, and no memory cell current flows ("0" state) even if the word line and the drain line are selected at the read operation.

In the programming operation, (1) the memory cell threshold voltages are brought into a low voltage state selectively from a high voltage state after erased. For such a purpose, (2) the drain voltage of the memory cells, i.e., data line voltage is set to positive voltage in a selected memory cell and 0V in an unselected memory cell at time of programming.

When loaded data are fetched into the device, the column address decoder YDCR is operated and data from an external terminal are loaded in the sense amplifier circuits SAC. Further, partial reprogramming in which data are preserved temporarily in the sense amplifier circuits SAC and only the necessary information of the memory cells is reprogrammed from the exterior of the device is also possible.

At time of programming operation, programming is performed by utilizing the data fetched into the sense amplifier circuits SAC. The data of the sense amplifier circuits SAC corresponding to the memory cells to be programmed maintains positive voltage, and the data of the sense amplifier circuits SAC which is not programmed have substrate voltage Vss. The programming operation is performed ("1" state) by setting the word line voltage corresponding to a sector in which programming is performed selectively to negative voltage, tunnel phenomena occur selectively by the voltage difference between the floating gate and the drain terminal, and pulling out electrons accumulated in the floating gates toward the drain side ("1" state).

Figure 21:
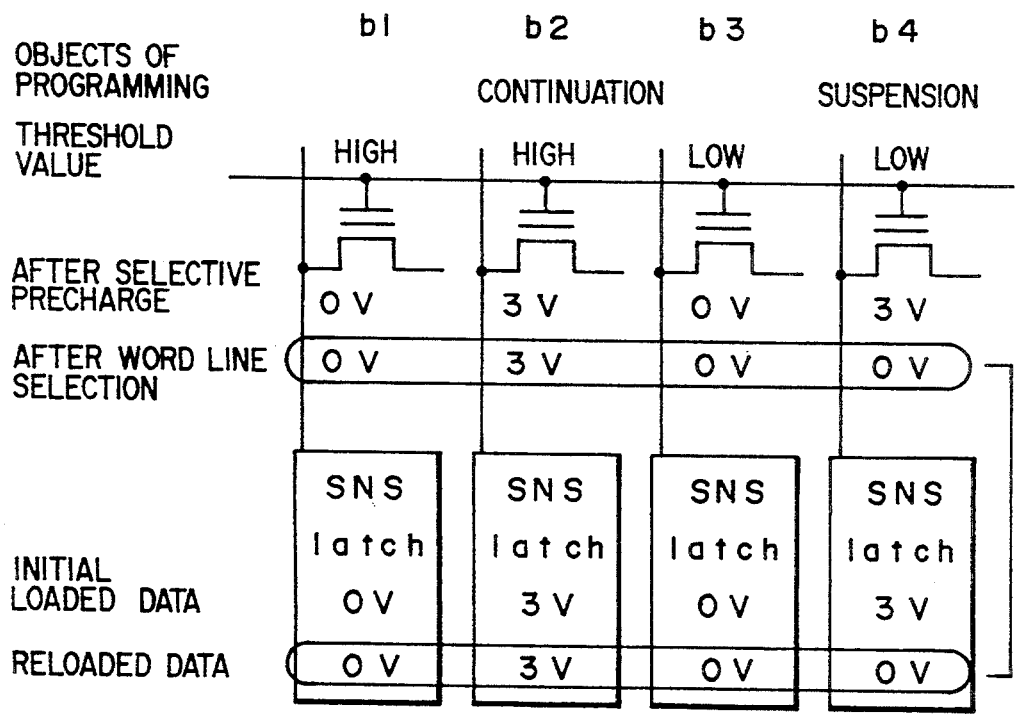
FIG. 21 is a diagram for explaining the precharging system by the definition of programming of the present invention.
Figure 22:
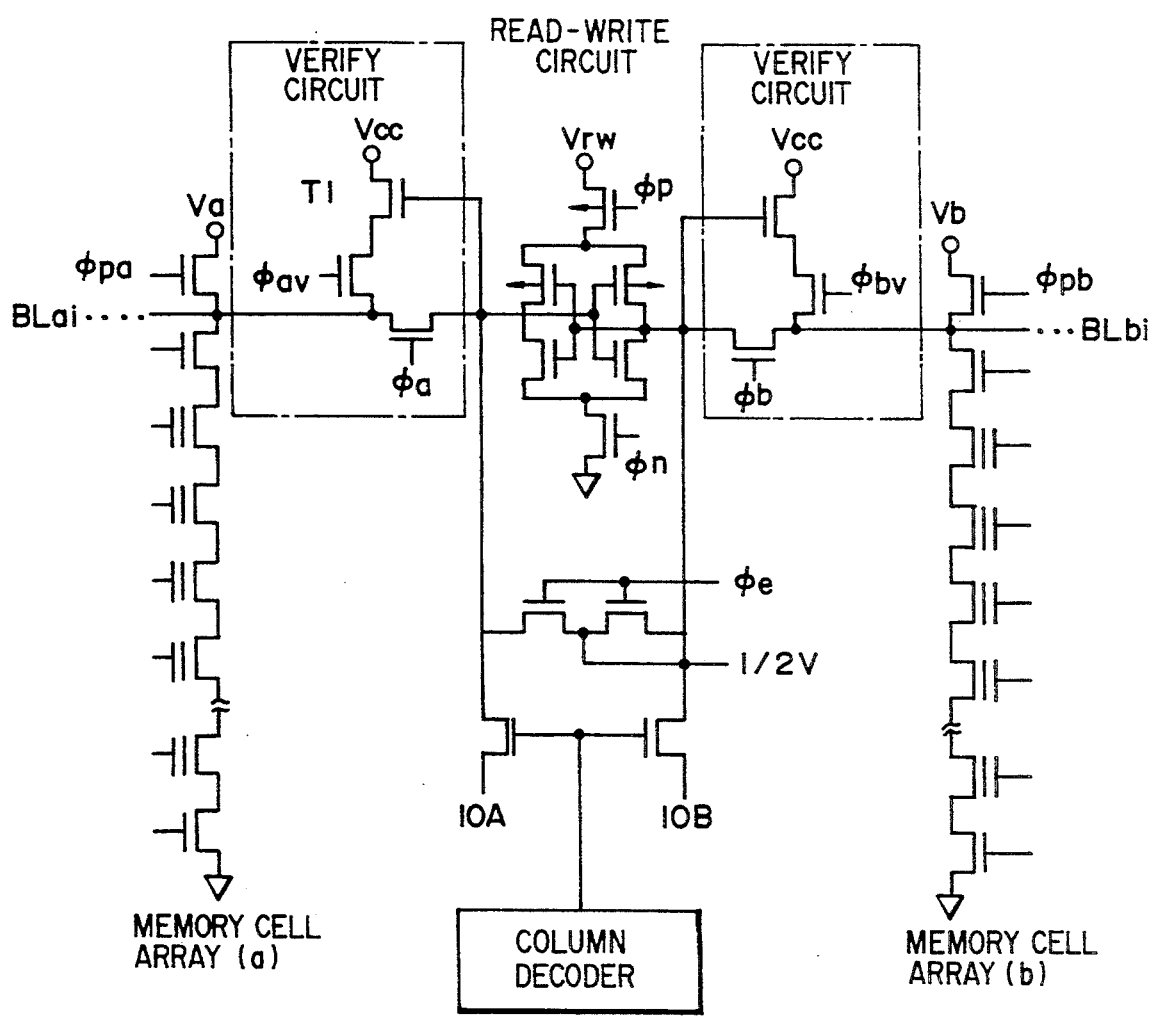
FIG. 22 is a block diagram of a conventional NAND-EEPROM reprogramming circuit.
Figures 23, 24:
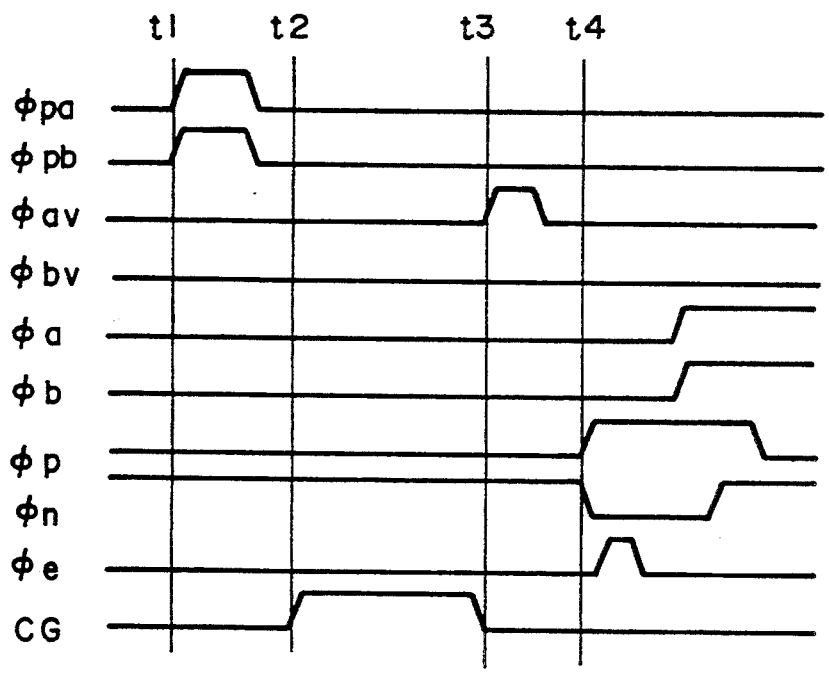
FIG. 23 shows a timing waveform diagram of a conventional NAND-EEPROM.
FIG. 24 is a table for explaining NAND-EEPROM cell data and loaded data in a conventional example.

The states of memory cells and data lines at time of programming are shown in FIG. 21. A state that the threshold voltages of the memory cells connected to the data lines b2 and b4 are high and the threshold voltages of the memory cells connected to the data lines b3 and b4 are low is assumed. Besides, loaded data to the memory cells are shown as initial loaded data. In the verify after loading, the data lines are precharged by means of the precharging circuits PCC (b2 and b4) in accordance with the initial loaded data. Then, after selecting the word line, the data line voltage is lowered from 3V to 0V in b4 only, but b2 is maintained at 3V since the threshold voltage of the memory cell is high. As a result, reloaded data are maintained at 3V in the sense latch circuit of b2 only.

After program-verify, memory cell state is detected by the using state detecting circuits ALLC. When information on data latch of the sense amplifier circuits SAC connected to each data line is in such a state that even one designates programming (3V), programming operation is repeated again. Further, when all data in the sense amplifier circuits SAC shows the programming completion in memory cell state detecting operation, the programming operation which has been performed repeatedly is terminated after the detection and determination operation comes to an end.

Besides, it is sufficient for the state detecting circuits ALLC, that the program state detecting circuit is composed of at least one MOSFET or a nonvolatile semiconductor memory cell similar to the memory cell, and the output from the sense amplifier circuit SAC is connected to the gate input of the MOSFET thereof with respect to each data line. In the case using a nonvolatile semiconductor memory cell same as the memory cell, it is possible to program the threshold voltages of nonvolatile semiconductor memory cells of ALCC corresponding to data lines connected to defective memory cells existing in memory arrays, thereby to remove data latch information of the sense amplifier circuit SAC connected to the data line out of the objects of determination.

At time of program-verify, the voltage of the selected word line is set to the power source voltage Vcc, and low voltage of approximately 1V is supplied to the data line from the precharge control circuit PCC. In the memory cell in an erased state ("0"), the threshold voltage is high and no drain current flows even when a word line W is selected at time of program-verify. Thus, the data line is maintained at 1V. Since the threshold voltage is low in a memory cell in a programmed state ("1"), the data line voltage becomes lower than the precharging voltage of 1V. The data line voltage is received by the sense amplifiers SAC so as to determine "0" or "1", which is outputted to an external terminal through a common data line via column selecting switch gates Q4, Q5 and Q6.

Since the word line voltage at time of program-verify is the power source voltage as described above, the threshold voltage of the memory cell has to be controlled with high precision at a low positive voltage value which does not become negative against the low voltage of the power source. Thus, programming in the programming operation is divided in several times, program-verify is performed whenever divided programming is made, and it is confirmed whether the threshold voltage of the memory cell has reached a programmed threshold voltage (program-verify). When insufficient, programming is repeated again. Voltage lower than the voltage used at time of normal read-out is applied to the word lines at time of program-verify described above. With such a fact, the upper limit value of distribution of threshold voltages in the group (sector) of the memory cells is controlled.

The first and the second objects of the present invention are achieved by the structure described above. Namely, continuation and suspension of the programming and program-verify sequence in reprogramming operation are determined by the memory cell state detecting circuit ALLC provided for each data line, so that programming when programming in selected memory cells connected to all data lines of the objects of programming has been completed is suspended.

Figure 2:
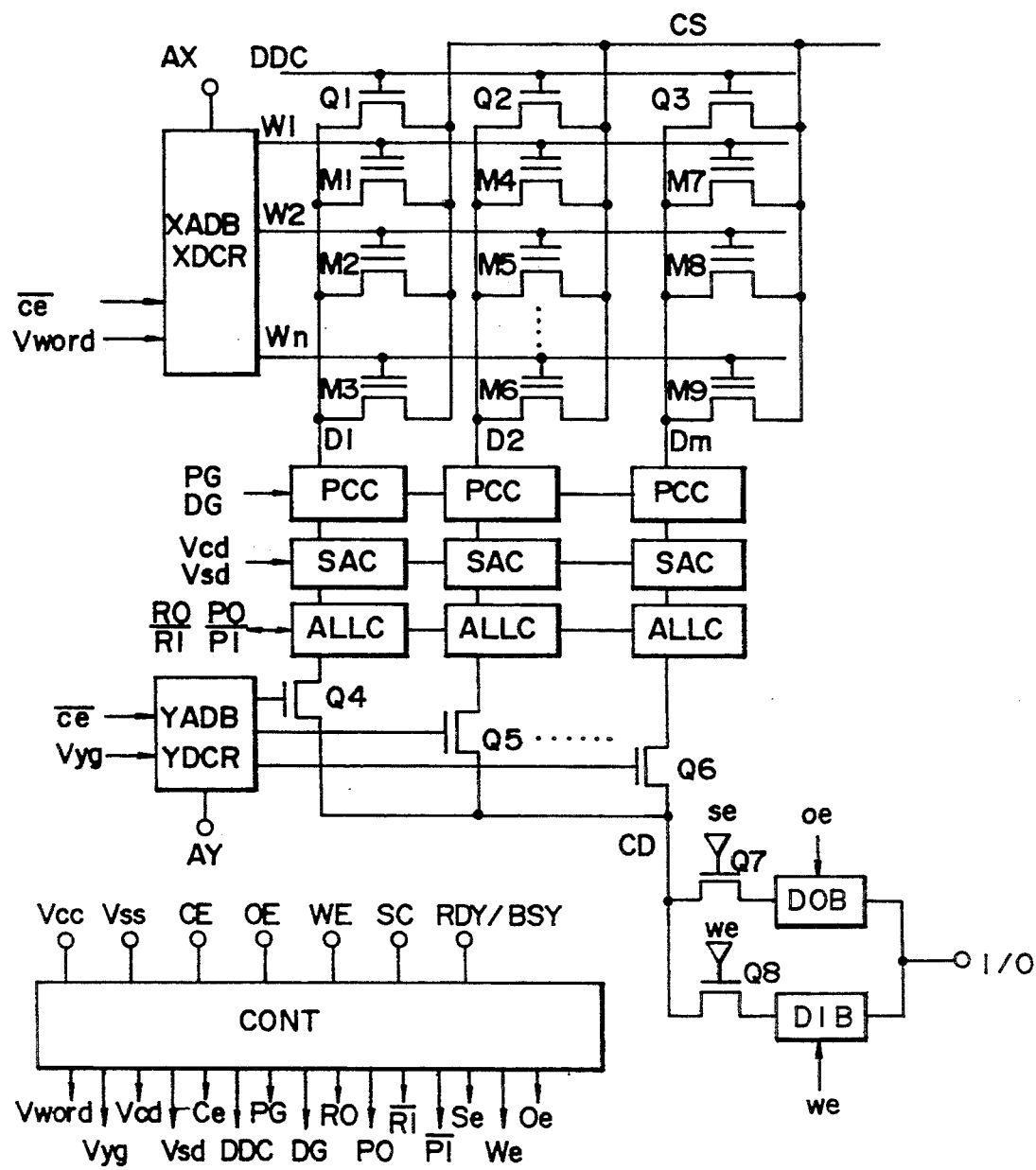
FIG. 2 is a circuit diagram showing an embodiment of a semiconductor nonvolatile memory device of the present invention.

FIG. 2 shows a circuit diagram of a semiconductor nonvolatile memory device obtained by extending FIG. 1. Respective circuit elements in FIG. 2 are formed on the same semiconductor substrate.

A complementary address signal formed through address buffer circuits XADB and YADB which receive a row address signal AX and a column address signal AY supplied from external terminals is supplied to a row address decoder XDCR and a column address decoder YDCR.

Further, respective data lines are connected to a common data line CD through column selecting gates Q4, Q5 and Q6 which receive the selecting signal formed by the address decoder YDCR. Furthermore, the common data line CD is connected to an external terminal I/O through a MOSFET Q8 which receives an internally generated program control signal we which is turned ON at time of programming and a data input buffer DIB for programming which receives a programming signal inputted from the external terminal I/O. The common data line CD is also connected to the external terminal I/O through a switch MOSFET Q7 which receives an internally generated program-verify control signal se which is turned ON at time of program-verify and a data output buffer DOB for program-verify.

Figure 3:
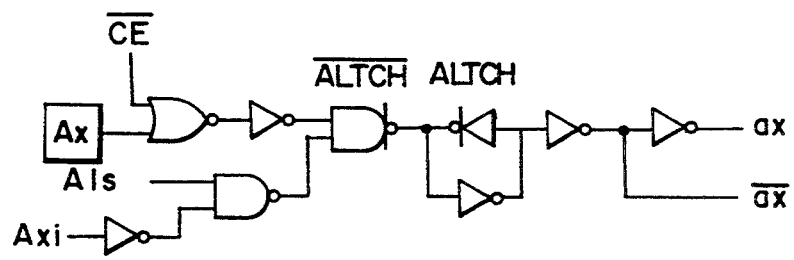
FIG. 3 is a diagram showing an example of an internal address buffer circuit of the present invention.

An embodiment of address buffer circuits ADB (XADB, YADB) is shown in FIG. 3. The row and column address buffer circuits XADB and YADB are activated by a selecting signal/a chip enable (CE) signal in the device, fetch an address signal Ax from an external terminal, and form a complementary address signal composed of an internal address signal ax in phase with the address signal supplied from the external terminal and an address signal $\overline{ax}$ in reverse phase. Besides, " " in the present specification expresses a complementary signal.

In FIG. 2, the row address decoder XDCR forms a selecting signal of a word line Wi of the memory array in accordance with the complementary signal of the row address buffer circuit XADB, and the column address decoder YDCR forms a selecting signal of a data line Di in accordance with the complementary address signal of the column address buffer circuit YADB in a similar manner as above.

Further, the address input signal in the present device may be only a word line system address signal. In this case, it is sufficient to generate a data line system address signal inside the device and to handle the data of the memory cell group connected to the selected word line continuously. The number of bytes in the memory cells connected to the same word line is assumed to be 512 bytes or 256 bytes for instance, and the unit thereof is defined as a sector.

In the address buffer circuit ADB in FIG. 3, functions of at least receiving the signal Ax from the exterior and latching the signal by internal signals ALTCH and $\overline{ALTCH}$ are required for the word line system address buffer circuit XADB. It is required for the data line system address buffer circuit YADB to at least receive an internally generated signal Axi and output complementary address signals ax and $\overline{ax}$.

Figure 4:
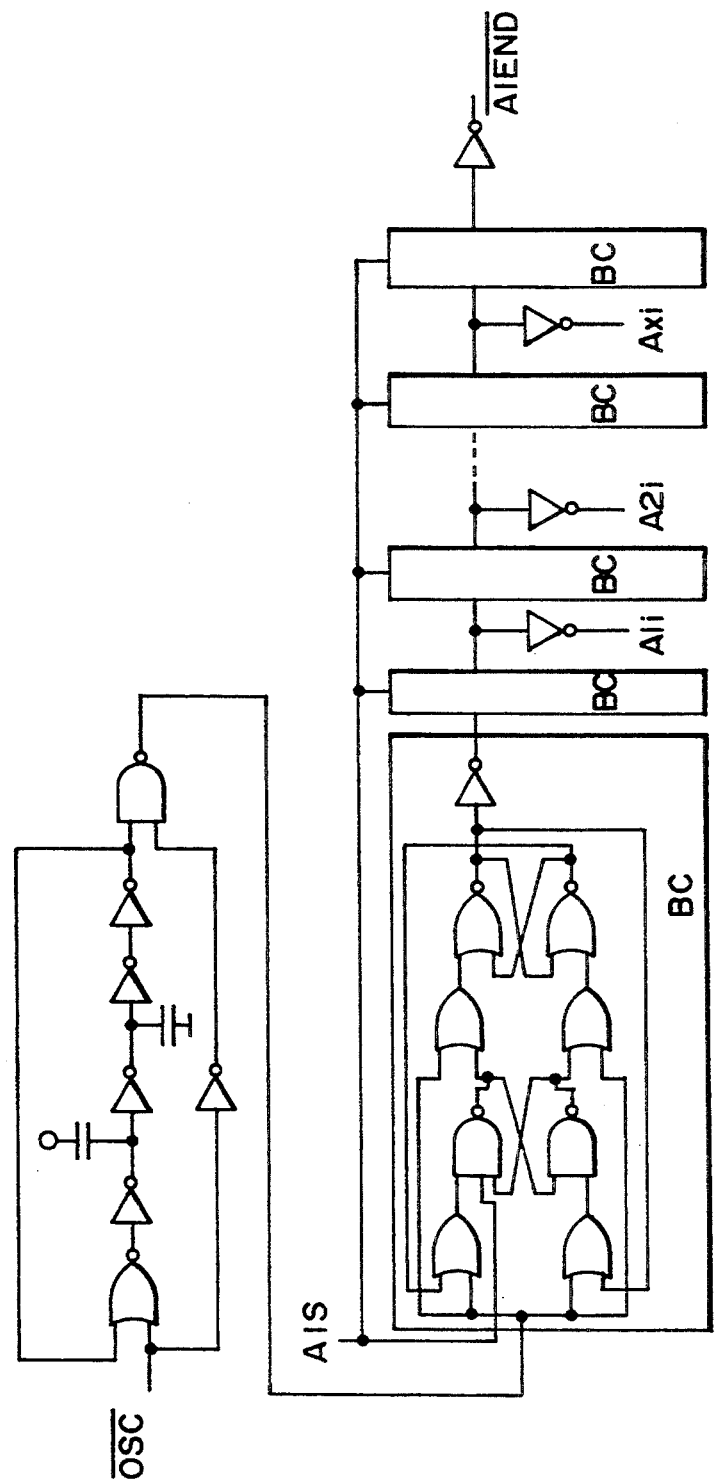
FIG. 4 is a diagram showing an example of an internal address automatic generation circuit of the present invention.

The internally generated signal Axi is generated by an internal address automatic generation circuit shown in FIG. 4 or the like. The circuit shown in FIG. 4 is composed of an oscillating circuit and a plurality of binary counters BC. Namely, a signal $\overline{OSC}$ for activating the internal oscillator is received so as to have the internal oscillating circuit oscillate, and an oscillation period signal thereof is received by the binary counters BC, and outputs of respective binary counters BC are generated as data line system address signals Ali to Axi.

Figure 5:
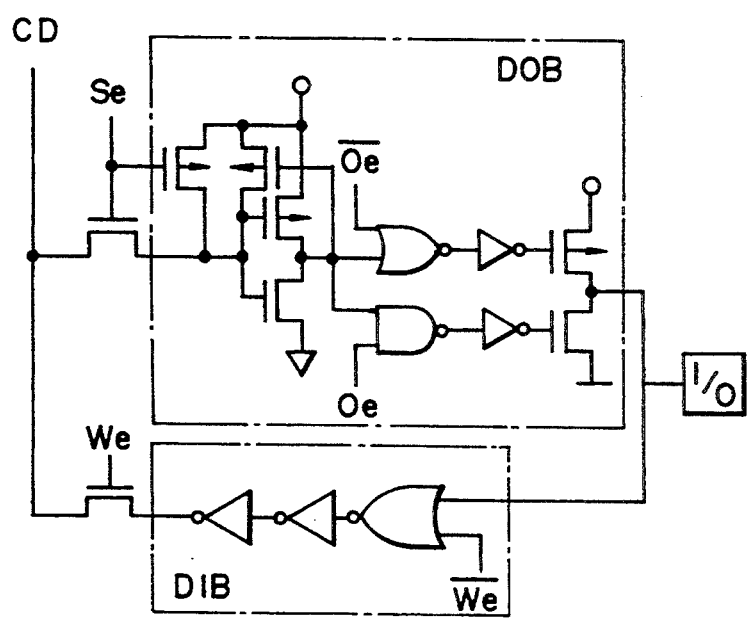
FIG. 5 is a diagram showing an example of an input-output buffer circuit of the present invention.

An embodiment of internal structures of the input buffer circuit DIB and the output buffer circuit DOB is shown in FIG. 5.

The input buffer circuit DIB is a buffer for receiving the data from the external terminal I/O by activation of an internal signal we and an inverted signal $\overline{we}$ thereof. The column gates Q4, Q5 and Q6 described above are selected in accordance with address for data transfer to the sense amplifier circuits SAC having a data latch function. The output buffer circuit DOB is a buffer for outputting data to the external terminal I/O at time of program-verify by activating internal signals oe and $\overline{oe}$ from the internal signal se described above and an external terminal output enable signal described later and so on. As a circuit structure, a voltage converting function is provided after pass gate with the internal signal se as the gate input. This is provided for the purpose of compensating lowering of the threshold voltage due to the pass-gate.

A timing control circuit CONT shown in FIG. 2 generates timing signals such as internal control signals ce, se, we, oe, DDC, PG, DG, $\overline{RO}$, $\overline{PO}$, $\overline{R1}$ and $\overline{P1}$, and internal power source voltage such as word line supply voltage Vword, data line supply voltage Vyg, sense amplifier circuit pMOS power source voltage Vcd and nMOS power source voltage Vsd for selectively feeding the row address decoder XDCR, the column address decoder YDCR and so on by internal voltage increase and internal voltage decrease from the power source voltage Vcc for instance in accordance with a chip enable signal, an output enable signal, a write enable signal, a serial control signal, a ready/busy signal or the like supplied to external terminals $\overline{CE}$, $\overline{OE}$, $\overline{WE}$, $\overline{SC}$, RDY/BSY and so on.

Further, it is possible to enter into an operation mode such as program-verify operation and reprogramming operation (erase operation and programming operation) by activation of the external signals $\overline{CE}$ and $\overline{WE}$ and input of data of the external terminal I/O, e.g., command input by program-verify operation 00H, erase operation 20H, and programming operation 10H or the like. A reprogramming command, a reprogramming sector address, sector information (data) and so on are fetched into the device from the external terminal for the operation of reprogramming the sector. At this time, it is possible to learn from the exterior whether during reprogramming operation, whether the reprogramming operation has been terminated, whether during erase operation or not and whether during programming operation or not by means of information of a status register (status polling) or a ready/busy signal.

Figure 6:
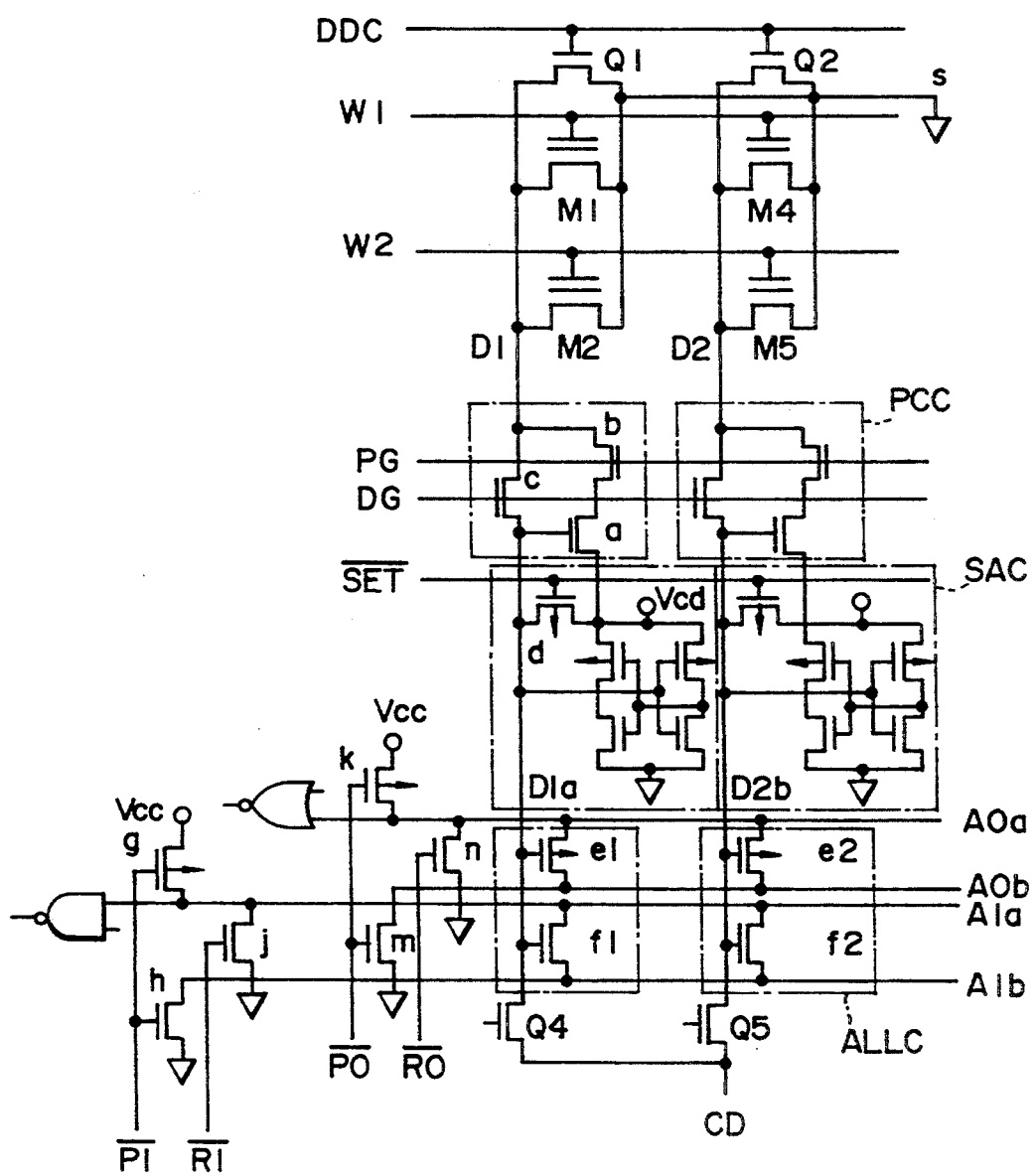
FIG. 6 is a block diagram of a first reprogramming circuit of the present invention.

FIG. 6 shows a block diagram of a first embodiment of a reprogramming circuit. Respective data lines D1 and D2 have the same (equivalent) connection structures. Speaking of the data line D1 (D2), a precharge control circuit PCC for controlling precharging of the data line, a sense amplifier circuit SAC having both sense function of data and data hold function of loaded data, and a state detecting circuit ALLC for determining the state of the memory cell with respect to data lines at the same time are connected between memory cells M1 and M2 (M4 and M5) and a column selecting gate Q4 (Q5).

The MOSFET group forming the precharge control circuit PCC is composed of at least that in which a MOSFET a with the output of the sense amplifier circuit SAC as a gate input and a MOSFET b with the precharging signal PG as a gate input are connected in series with each other and a MOSFET c provided in parallel with these serially connected MOSFET a and MOSFET b and with the data line gate signal DG for connecting the data line D1 (D2) to the sense amplifier circuit SAC as a gate input. It is structured so that the data lines may be precharged selectively by the precharging signal PG and the data of the sense amplifier circuit SAC. The voltage value of the precharging signal PG is such that at least voltage lower than the power source voltage is applied at every verify time and time of program-verify. This is for such a purpose that weak programming and weak erase are not generated by setting the voltage of the data line to approximately 1V.

The sense amplifier circuit SAC is composed of a MOSFET d with an internal signal $\overline{SET}$ for setting the sense amplifier circuit SAC as the gate input and a plurality of MOSFETs forming a latch circuit. The sense amplifier circuit SAC acts as a sense amplifier having a feature of a flip-flop circuit at time of program-verify, and acts as a latch circuit for holding loaded data at time of reprogramming. The power source voltage Vcd of the sense amplifier circuit SAC during reprogramming operation may be made equal to the drain voltage of the memory cell at time of programming operation, and also, may be fixed to the programming drain voltage without switching the power source for respective operations in the programming operation and the read-out (program-verify) operation during reprogramming operation.

The memory cell state detecting circuit ALLC has a structure that it is formed of each one of MOSFETs, p-channel MOSFETs ei (i=1, 2) for erase state detection and n-channel MOSFETs fi (i=1, 2) for loaded state detection, with respect to each data line Di (i=1, 2), and the output from the sense amplifier circuit SAC is connected to the gate of the state detecting MOSFET. Drains and sources of MOSFETs of these p-channel MOSFETs ei and n-channel MOSFETs fi are made common with one another (A0a, A0b, A1a and A1b). Besides, the state detecting system is not limited to the present system, but may be a current sense system or a voltage sense system.

Figure 7:
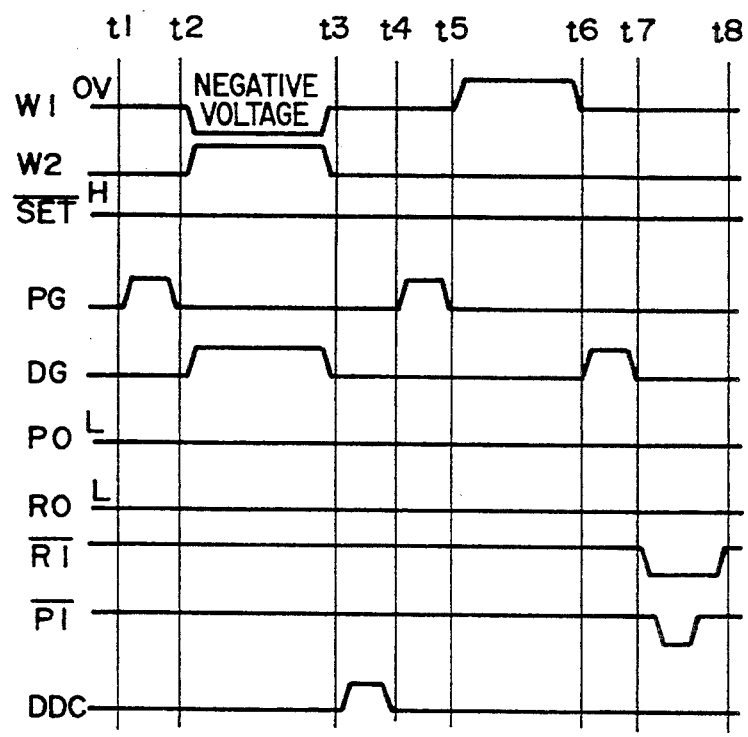
FIG. 7 shows programming and program-verify operation timing waveforms of the present invention.

FIG. 7 shows device internal signal timing waveforms in the reprogramming operation by the precharging system. As described previously, programming, program-verify and programmed state detecting operations are performed repeatedly in the reprogramming operation.

Loaded data are fetched into the sense amplifier circuits SAC until t1. The data of the sense amplifier circuit connected to the data line for selecting programming may be at either Vcd or external power source voltage Vcc. The data with programming unselected are at the substrate voltage Vss.

During from t1 to t2, the precharging signal PG is activated, and only the data line performing programming with the data of the sense amplifier circuit SAC is precharged selectively. Since the voltage is Vcd in the data ("1") for performing programming, the MOSFET a in the precharge control circuit PCC shown in FIG. 6 shows an ON-state and can apply voltage to the data line Di. On the other hand, when an erased state ("0") is maintained, the MOSFET a shows an OFF-state and does not supply voltage to the data line Di.

During from t2 to t3 in FIG. 7, the signal DG of the gate input of the MOSFET c in the precharge control circuit PCC is activated, and data information ("1" represents voltage Vcd, and "0" represents voltage Vss) of the sense amplifier circuit SAC is given to the drain terminal of the memory cell. Further, when it is assumed that the programming selected sectors are the sectors of the memory cell group (M1, M4) in FIG. 6, voltage is applied between the selecting word line W1 applied with negative voltage and the drains at the programming data voltage Vcd, electrons are injected by a tunnel phenomenon into the floating gates from the drains, thus performing programming. As to the voltage of an unselected word line W2, positive power source voltage is applied in order to control disturb phenomena caused by the drain voltage (data voltage Vcd).

Figure 10:
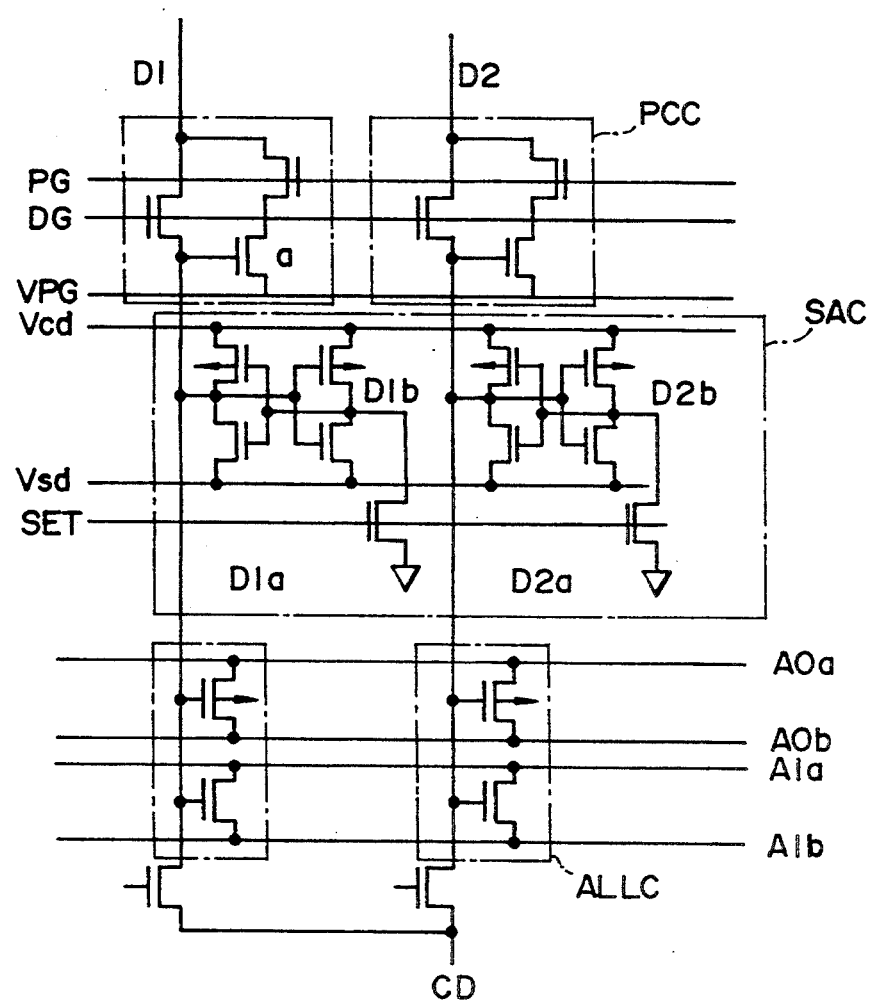
FIG. 10 is a block diagram of a second reprogramming circuit of the present invention.

During from t3 to t4, DDC which is a gate signal of the data line discharging MOSFET is made high, and data line discharging MOSFETs Q1 and Q2 shown in FIG. 10 are activated, thus discharging the data line voltage. Thereafter, programming-verify operation is started.

During from t4 to t5, the precharging signal PG is activated, and only the data line in which programming has been selected is precharged by the operation of the sense amplifier circuit SAC and the MOSFET a in the precharge control circuit PCC similarly to the operation during from t1 to t2.

During from t5 to t6, voltage lower than the power source voltage (approximately 1.5V for instance) used at time of normal program-verify applied to the selected word line W1.

Electric charges accumulated in parasitic capacitance of the data line Di are discharged selectively depending on the threshold voltage of the memory cell. Namely, when the threshold voltage of the memory cell in which programming is made reaches a desired low threshold voltage, an electric current flows in the memory cell and the voltage of the data line is lowered. When the programming threshold voltage is not reached, the data line Di maintains the precharged voltage. The electric current of the memory cell is prevented from flowing stationarily by setting the timing (t5) for inactivating the data line precharging signal PG before activation of the word line selecting signal.

During from t6 to t7, the signal DG of the gate input of the MOSFET c in the precharge control circuit PCC for connecting the data line Di and the sense amplifier circuit SAC to each other is activated, and the voltage of the data line Di is determined by the sense amplifier circuit SAC. The determination is made by the result of charge share among parasitic capacitance of the data line Di, parasitic capacitance in the sense amplifier circuit SAC, the voltage of the data line Di and the data voltage (Vcd) of the sense amplifier circuit. When the voltage of the data line Di is higher than a logical threshold voltage of the sense amplifier circuit SAC, the selected voltage (Vcd) of the loaded data is maintained as it is, and when the voltage is lower than the logical threshold voltage, the data of the sense amplifier circuit SAC show substrate voltage Vss, thus performing reprogramming of the loaded data automatically. Further, the signal DG of the gate input of the MOSFET c in the precharge control circuit PCC becomes inactive upon completion of determination by the sense amplifier.

During from t7 to t8, state detection and determination are made on the memory cells to find whether all of the memory cells in which programming is made have completed programming operation or not. In FIG. 6, the program state detecting circuit ALLC has a multiinput NOR gate structure of a precharging system dynamic circuit, in which it is formed of one n-channel MOSFET fi for each data line Dia, the gate of the MOSFET fi is connected to the output Dia of the sense amplifier circuit SAC and sources and drains are used in common (Ala, Alb), respectively. The source line Ala and the drain line Alb which are made in common are reset to the substrate voltage Vss in advance by signals $\overline{R1}$ and $\overline{P1}$ and MOSFETs h and j, and reset is sustained at the timing of t7.

The internal signal $\overline{P1}$ turns low and the common source line Ala rises to the power source voltage Vcc due to activation of a MOSFET q shown in FIG. 6, and ON-OFF of the n-channel MOSFET fi is controlled by the data of the sense amplifier circuit SAC. Therefore, it is possible to determine programming of the memory cell group (sector) on all data lines at the same time. When the data of at least one sense amplifier circuit SAC are those (Vcd) that continue programming, the voltage of the common source line Ala becomes the substrate voltage Vss. On the other hand, in the case that all data are those completed with programming (substrate voltage Vss), the voltage of the common source line Ala is maintained at the power source voltage Vcc which is a precharged voltage value. Continuation (returning to t1) and suspension of the programming and program-verify sequence are controlled in the device based on the information described above.

Figure 8:
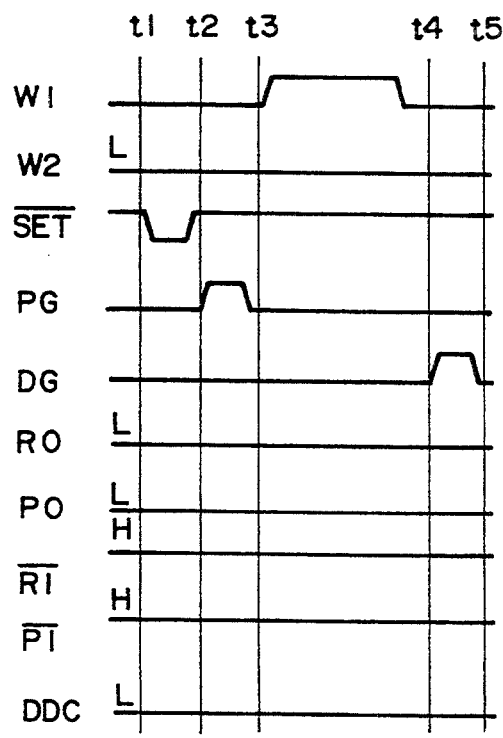
FIG. 8 shows read-out operation timing waveforms of the present invention.

FIG. 8 shows timing waveforms of signals in the device in normal program-verify operation. In this case, since the memory cell group (sector) which is an object of program-verify is connected to all data lines, the data of the sense amplifier circuits SAC in FIG. 6 are activated with an internal signal $\overline{SET}$ and set to the voltage Vcd during from t1 to t2.

During from t2 to t5, the waveforms are the same as those in the program-verify operation described above (t4 to t7 in FIG. 7), but only the voltage of the selected word line Wi is different, and is the voltage Vcc at time of normal program-verify. Further, the power source voltage Vcd of the sense amplifier circuit SAC may be at the external power source voltage Vcc.

Figure 9:
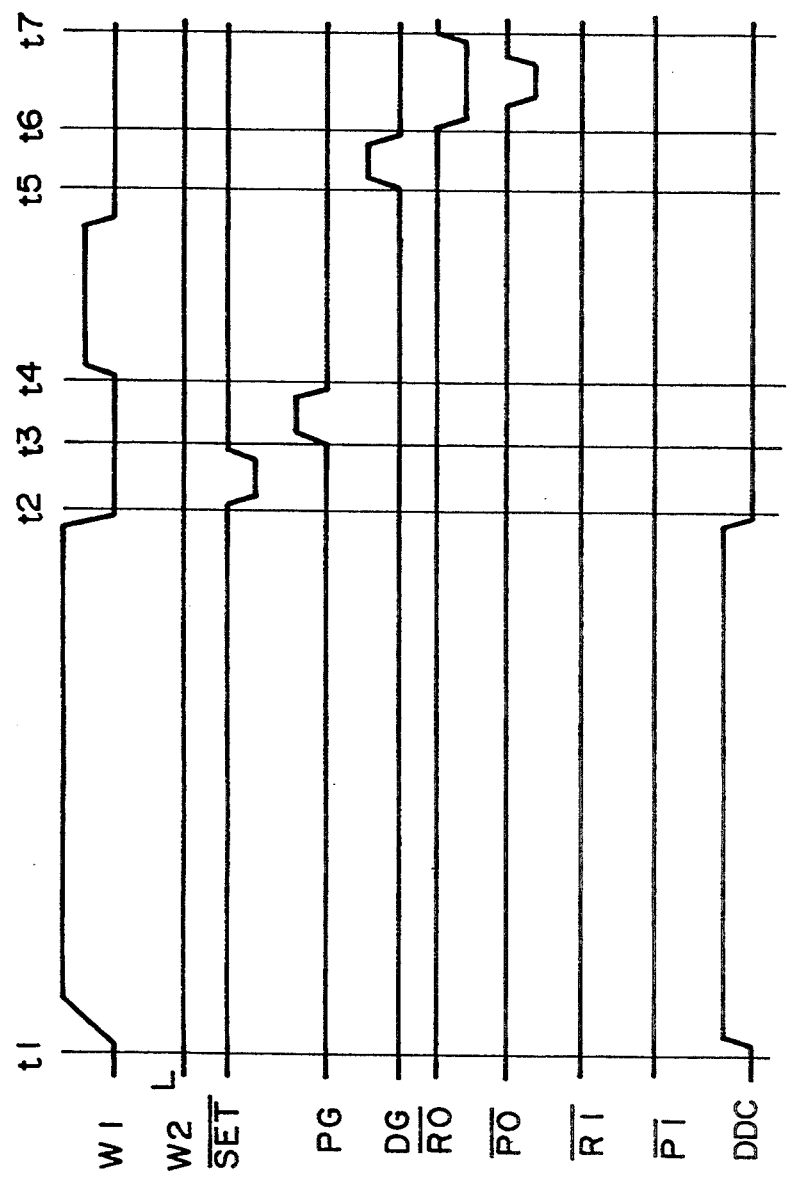
FIG. 9 shows erase and erase-verify operation timing waveforms of the present invention.

FIG. 9 shows timing waveforms of signals in the device in erase operation and erase-verify operation. During from t1 to t2, positive high voltage is applied to the selected word line W1 in FIG. 6, the data line Di is activated by a common gate signal DDC of discharge MOSFETs Q1 and Q2 and shows the substrate voltage Vss, and voltage difference is produced between the channel and the floating gate of the memory cell, thus starting erase operation in which electrons are injected into the floating gate.

During from t2 to t6 thereafter, erase-verify operation is performed similarly to the normal program-verify operation described above. The voltage (5V for instance) higher than the power source voltage Vcc at time of normal program-verify is applied to the selected word line W1 at time of erase-verify.

During from t5 to t6, a signal DG of the gate input of the MOSFET c in the precharge control circuit PCC connecting the data line Di and the sense amplifier circuit SAC shown in FIG. 6 to each other is activated, and the voltage of the data line Di is determined by the sense amplifier circuit SAC. The determination is made depending on the result of charge share among the parasitic capacitance of the data line Di, the parasitic capacitance in the sense amplifier circuit SAC, the voltage of the data line Di and the data voltage (Vcd) of the sense amplifier circuit. When the voltage of the data line Di is higher than the logical threshold voltage of the sense amplifier circuit SAC, the selected voltage (Vcd) of the erased data is maintained as it is, and, when the voltage is lower than the logical threshold voltage, the data of the sense amplifier circuit SAC shows the substrate voltage Vss, thus performing reprogramming of the erased data automatically. Further, activation of the signal DG of the gate input of the MOSFET c in the precharge control circuit PCC becomes inactive upon termination of the determination by the sense amplifier.

During from t6 to t7, state detection and determination of the memory cells to find whether all threshold voltages of the memory cell group (sector) erased have reached the erase threshold voltage are performed. In FIG. 6, the erase state detecting circuit has a multiinput NAND gate structure of a precharging system dynamic circuit in which it is formed of one p-channel MOSFET ei for each data line Dia, the gate of the MOSFET ei is connected to the output Dia of the sense amplifier circuit SAC and sources and drains are made common to one another (A0a, A0b). The source line A0a and the drain line A0b which are made common to each other are reset to the substrate voltage Vss in advance by signals P0 and R0 and MOSFETs m and n, and reset is released at the timing of t6.

The internal signal $\overline{P0}$ turns low, the common drain line A06 rises to the power source voltage Vcc by activation of a MOSFET k, and ON-OFF of the p-channel MOSFET ei is controlled in accordance with the data of the sense amplifier circuit SAC. With this, erase determination on the memory cell group (sector) can be made on all data lines at the same time. When the data of at least one sense amplifier SAC are those (Vcd) that continue erase, the voltage of the common source line A0a maintains the power source voltage Vcc which is the precharged voltage value. On the other hand, when all the data are those completed with erase (substrate voltage Vss), the voltage of the common source line A0a shows the substrate voltage Vss. Continuation (returning to t1) of the erase operation and suspension thereof are controlled in the device based on the information described above.

FIG. 10 shows a block diagram of an embodiment of a second reprogramming circuit. A precharge control circuit PCC, a sense amplifier circuit SAC and a state detecting circuit ALLC are provided for each data line Di similarly to the block diagram of the first reprogramming circuit. The difference from the block diagram of the first reprogramming circuit will be described. Firstly, the precharging voltage to the data line is controlled with the voltage value of the precharging signal PG in the precharge control circuit PCC. This control is made at the source voltage VPG of the MOSFET a connected in series therewith. Secondly, the sense amplifier circuit SAC receives a set signal of SET, which is connected to Dib in a latch circuit forming the sense amplifier circuit SAC. Thirdly, the power source wirings Vcd and Vsd in the sense amplifier circuit SAC are common to a plurality of sense amplifier circuits SAC (such as mats). Further, supply of the power source voltage or an open node state of power source wirings thereof are made possible.

In the present embodiment, it is possible to lower a peak value of a consumed current in the sense amplifier circuit SAC by dividing the memory cell array into two or more blocks and shifting activation timing of various internal control signals such as a precharging signal PG, a data line gate signal DG and a latch set signal $\overline{SET}$ used in respective blocks for each block.

Figure 11:
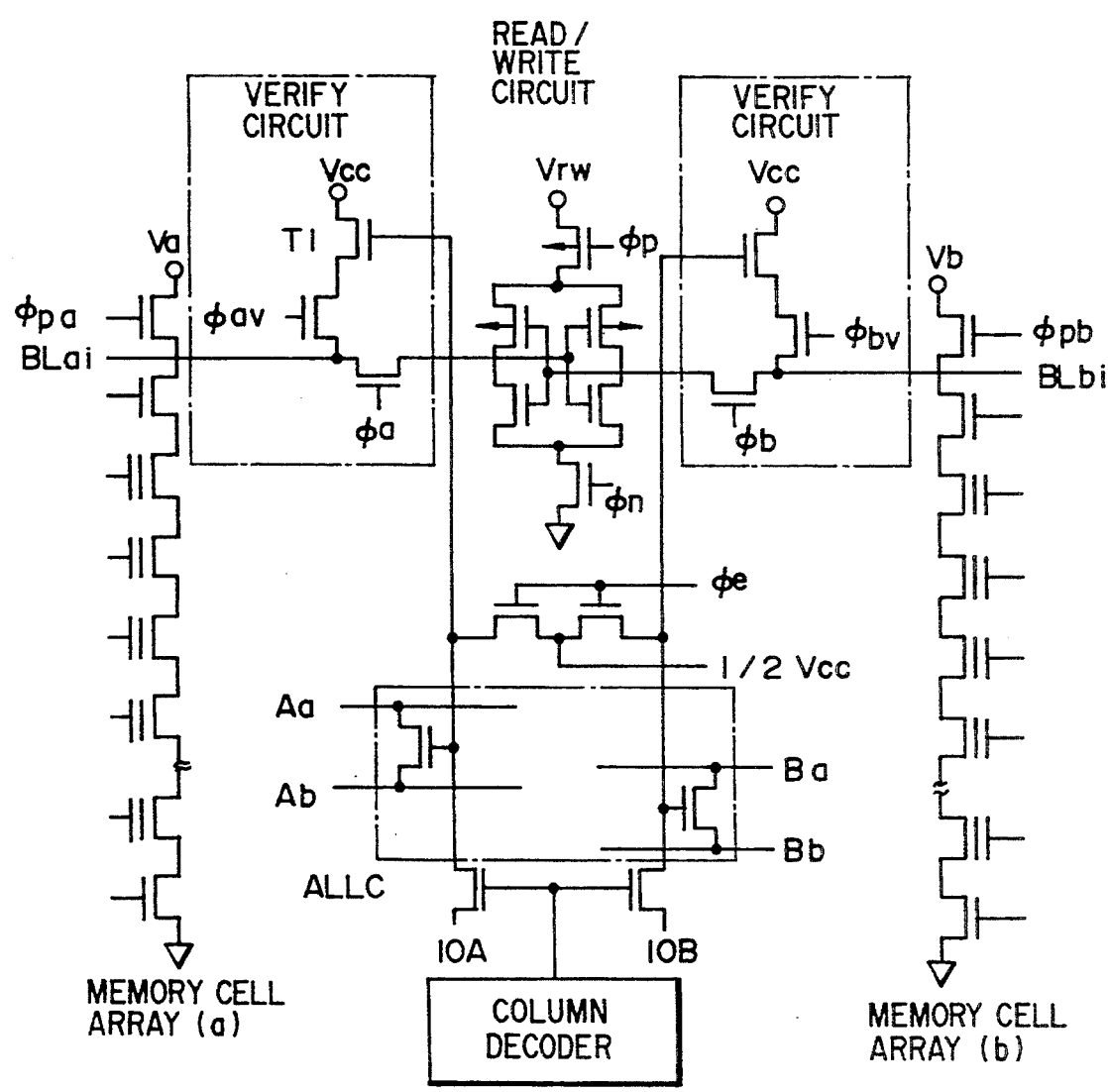
FIG. 11 is a block diagram of a NAND-EEPROM reprogramming circuit in the present invention.

FIG. 11 shows a block diagram of a reprogramming circuit in which the present invention is applied to a NAND-EEPROM. The memory cell state detecting circuit ALLC is composed of one each of MOSFETs having two input-output wirings of a read/write circuit at the gate inputs in the device of the NAND-EEPROM. The drains and the sources of these MOSFETs are made common with the data line, thus forming a multi-input NOR gate structure as a precharging system dynamic circuit. It is sufficient to use Aa and Ab sides by a precharging system similarly to the timing described above for simultaneous determination by all data lines on low threshold voltages (an erased state) of the memory cell group on the side of the array a, and the Ba and Bb sides are used for high threshold voltages (a write state).

Figure 12:
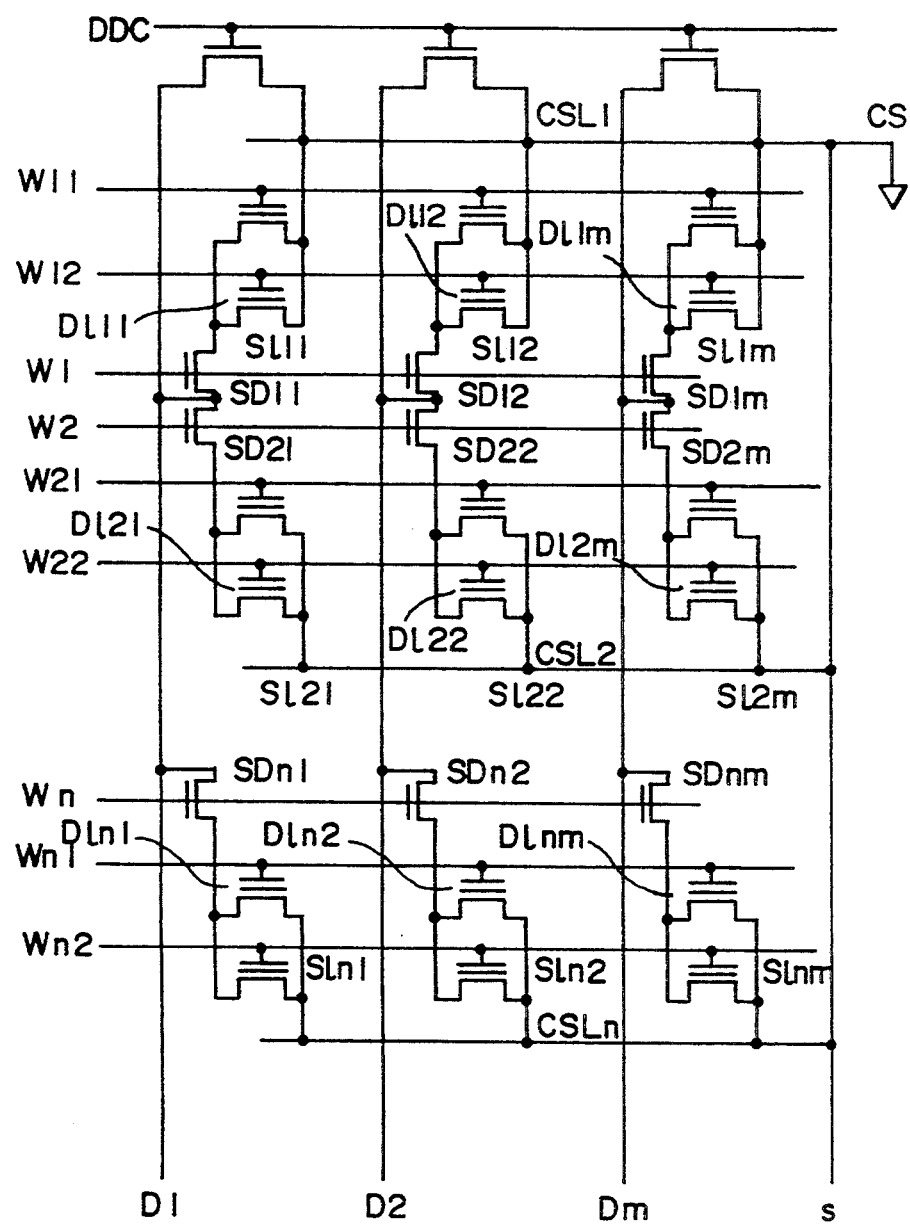
FIG. 12 is a circuit diagram of a second memory array of the present invention.

FIG. 12 shows a circuit diagram of the second memory array of the present invention. It is shown in the circuit diagram that at least two or more memory cells are connected by diffused layers Dlnm or the like and drain selecting MOSFETs nm with a word system signal Wn as gate inputs are connected between the common drain diffused layer wirings Dlnm and the data lines Dm.

Figure 13:
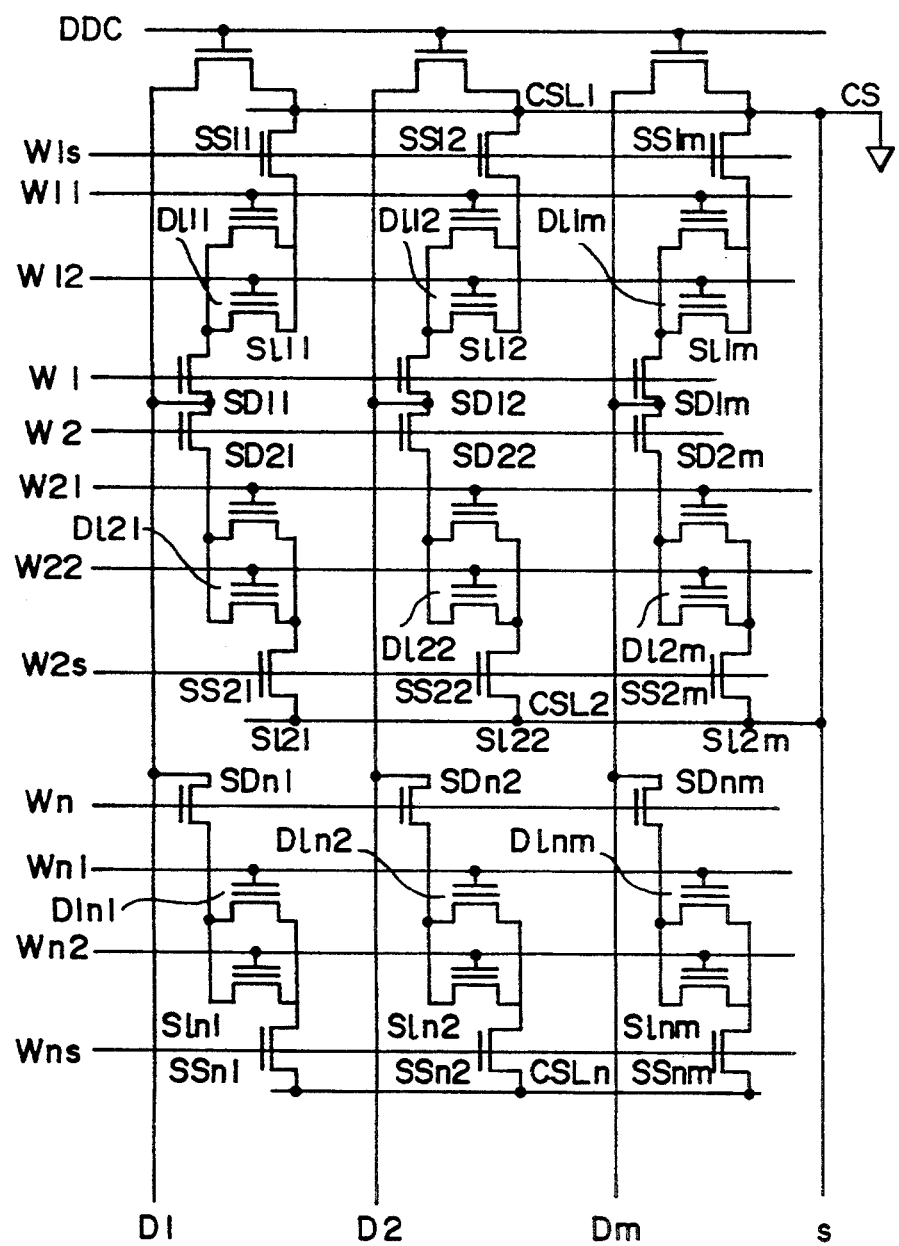
FIG. 13 is a circuit diagram of a third memory array of the present invention.
Figure 14:
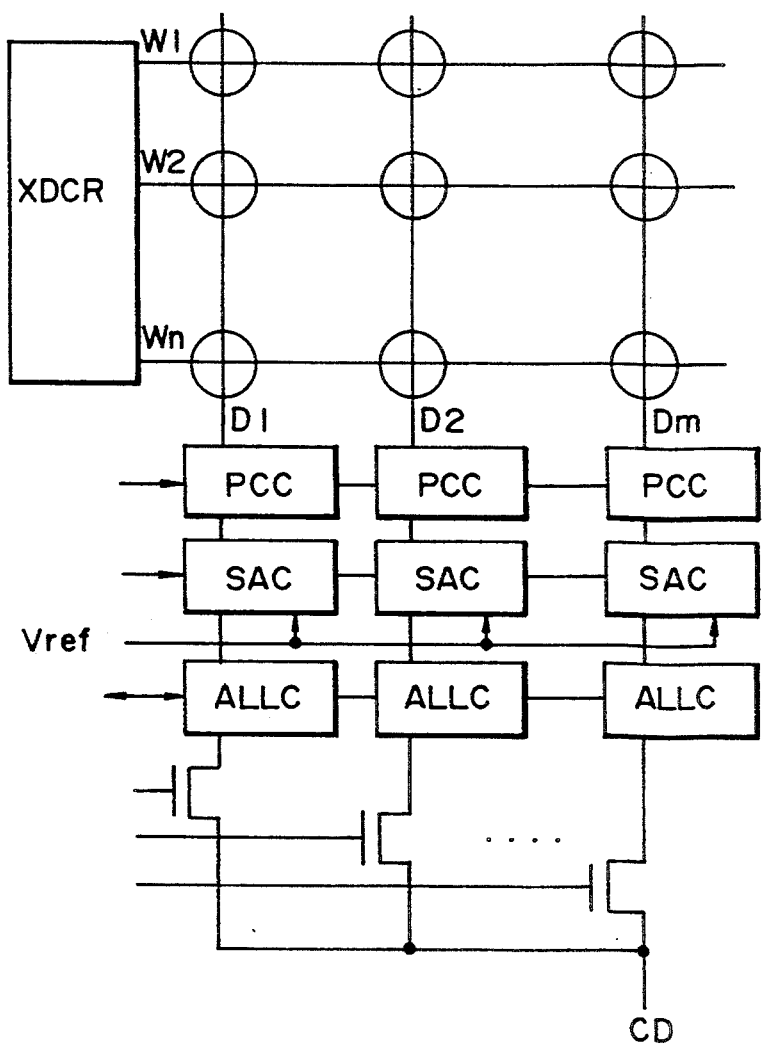
FIG. 14 is a block diagram of a second mat of the present invention.

When the word lines are formed in a hierarchical structure, memory array constructions shown in FIG. 13 and FIG. 14 are also possible. A circuit diagram of a third memory array of the present invention is shown in FIG. 13. In this circuit diagram, at least two or more memory cells are connected by diffused layers Dlnm, Slnm or the like, and drain selecting MOSFETS Dnm with word system signals Wnd as the gate inputs are connected between the common drain diffused layer wirings Dlnm and the data lines Dm and source selecting MOSFETs SSnm with word system signals Wsn as the gate inputs are connected between the common source diffused layer wirings Slnm and the diffused layer wirings CSln connected to the common source line CS. In FIG. 13, W11, W12, W1, W2, W21, W22, ..., Wn, Wn1 and Wn2 represent word lines having a hierarchical structure, and access is controlled at two stages. When word lines are expressed as Wn and Wnd in general, the suffix n indicates the first signal (main signal) for selecting the word line, and "2" indicates the second signal (sub-signal)for selecting the word line. For example, W2 is activated when the first signal (main signal) for selecting the word line is "2", and W21 is activated when the first signal (main signal) for selecting the word line is "2" and the second signal (sub-signal) for selecting the word line is 1.

In the layout of the device, almost the whole surface of the memory cell array area is covered with word lines. The unselected word lines reach several thousand lines in quantity and the word line voltage thereof is at the substrate voltage Vss in normal program-verify operation and each verify operation. Therefore, the parasitic capacitance among data lines and word line system wirings is stabilized.

FIG. 14 shows an embodiment of the present invention having a mat structure with second plurality of memory cell groups formed into a block. Reference voltage Vref is applied in place of the substrate voltage Vss to the precharge control circuit PCC of the latch circuit forming the sense amplifier circuit SAC and wirings on the opposite side which are not connected to the state detecting circuit ALLC (Dib in FIG. 10). With this, the program-verify determination ("1", "0") by the sense amplifier circuit SAC can be made by comparing with the reference voltage Vref.

Figure 15:
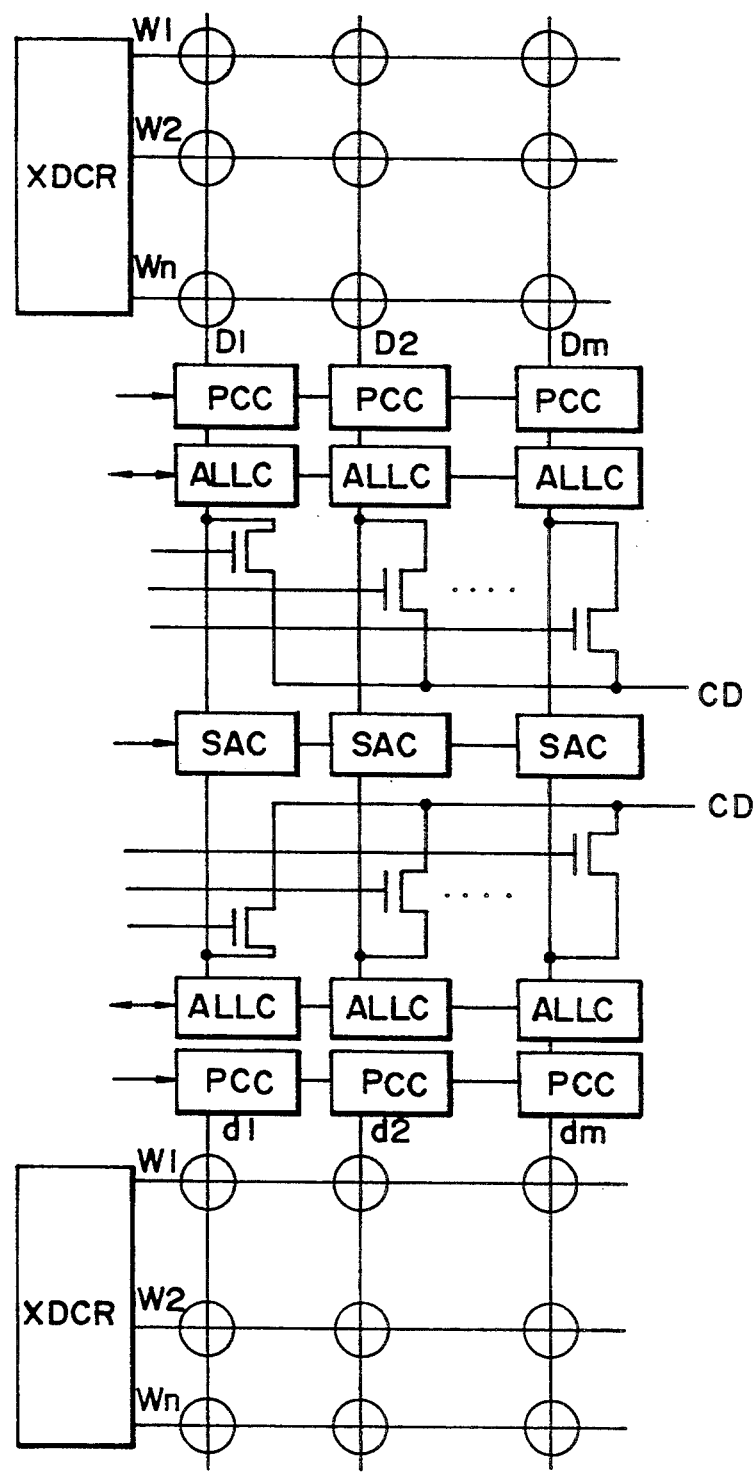
FIG. 15 is a block diagram of a third mat of the present invention.

FIG. 15 shows an embodiment of a third mat structure of the present invention. It has an open bit line structure in which the memory mat is divided into two sections. The block diagram of the second reprogramming circuit shown in FIG. 10 corresponds to this mat structure.

Figure 16:
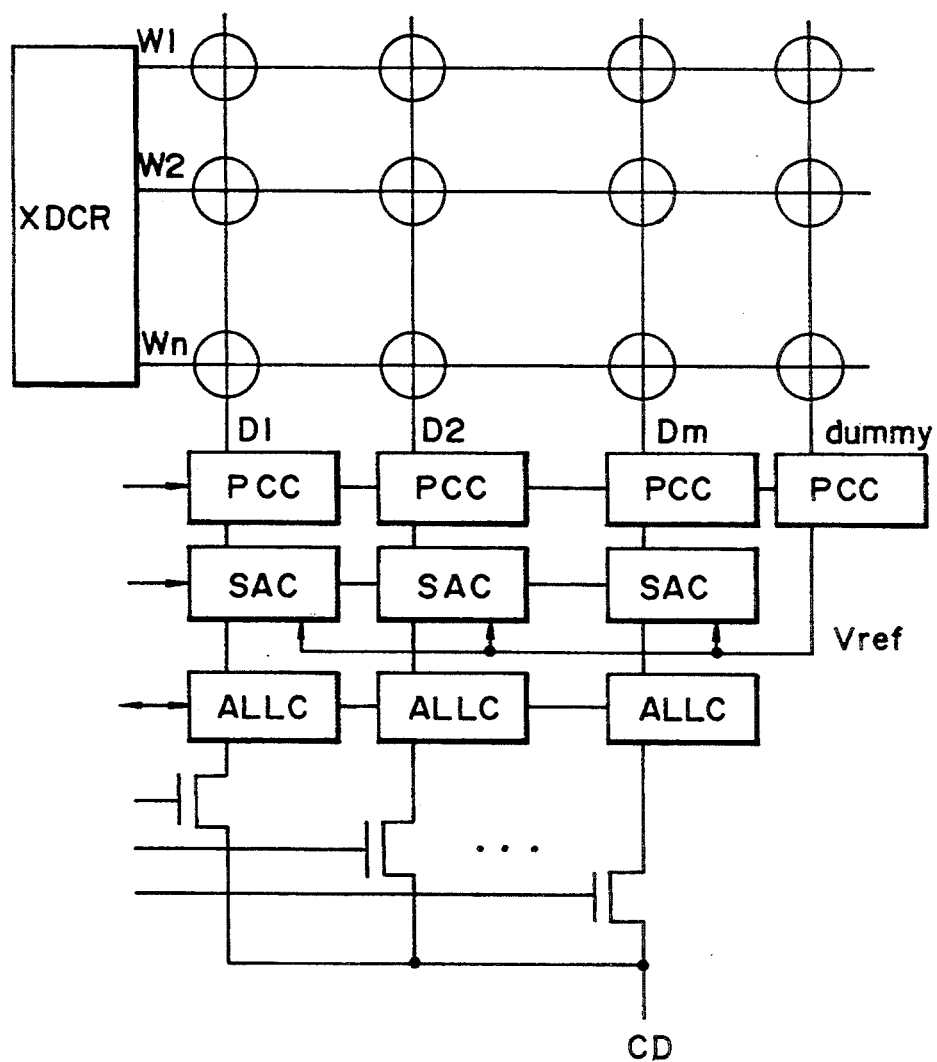
FIG. 16 is a block diagram of a fourth mat of the present invention.

FIG. 16 shows an embodiment of a fourth mat structure of the present invention. The difference from FIG. 14 is a fact that a reference dummy data line is provided, the same parasitic capacitance as that of normal data line Di is provided, and reference dummy data line voltage is used for generating the reference voltage Vref.

Figure 17:
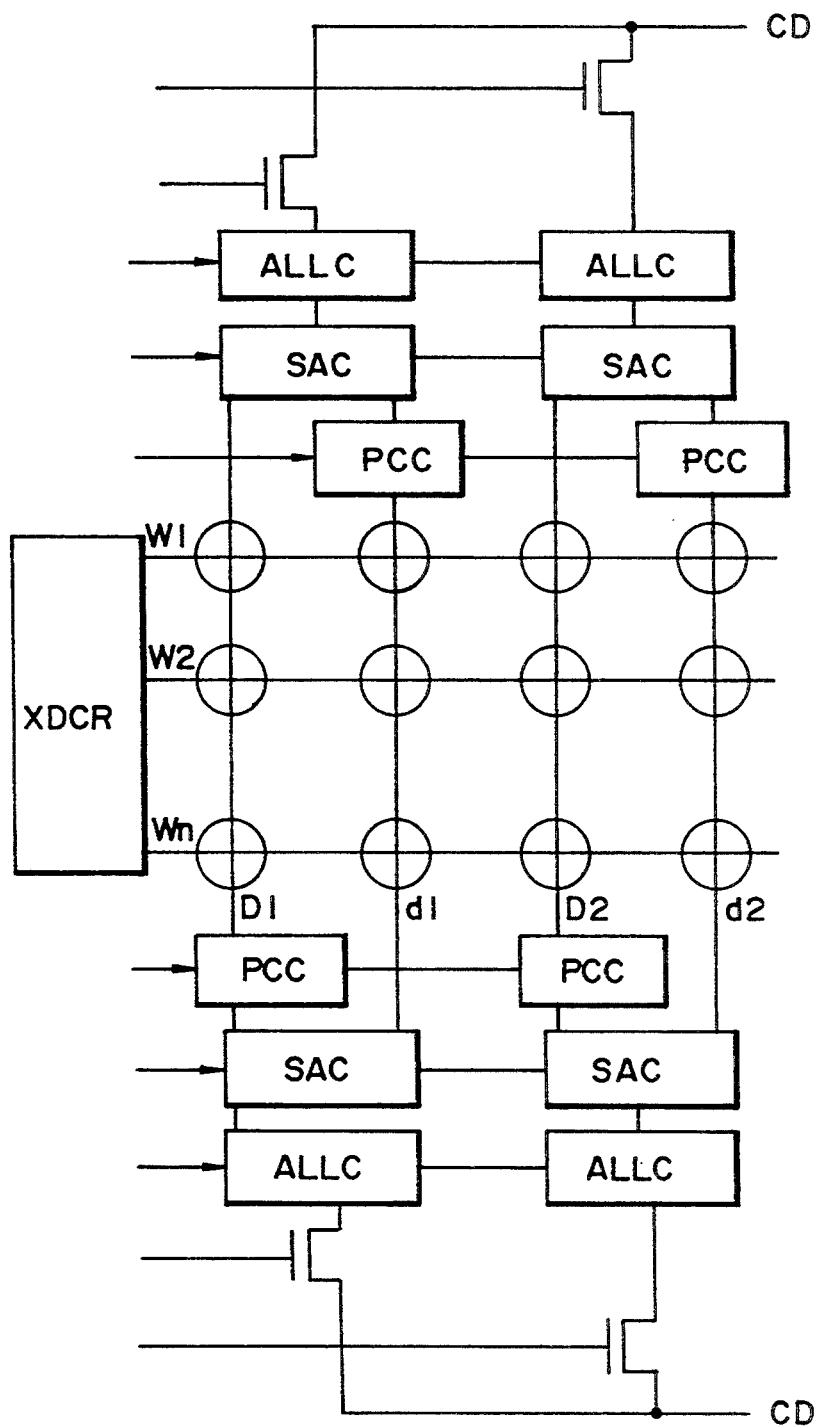
FIG. 17 is a block diagram of a fifth mat of the present invention.
Figure 20:
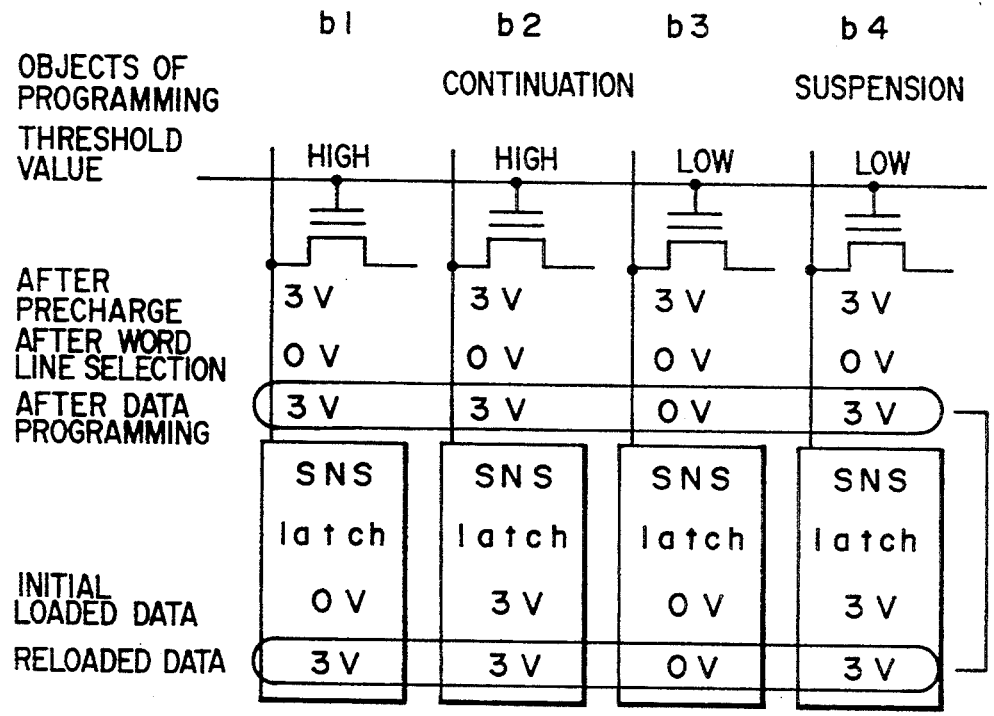
FIG. 20 is a diagram for explaining the verify system by the definition of programming of the present invention.

FIG. 17 shows an embodiment of a fifth mat structure of the present invention. Precharge control circuits PCC, sense amplifier circuits SAC and state detecting circuits ALLC are arranged below and above the memory mat, and are operated in the units of odd-numbered data lines and even-numbered data lines. When the odd-numbered data lines are operated, the even-numbered data lines are used as reference dummy data lines. Further, when the even-numbered data lines are operated, those on the side of the odd-numbered data lines serve as reference dummy data lines.

FIG. 18 shows an embodiment of a sixth mat structure of the present invention. The memory cells forming the memory mat are arranged at intersecting points of the odd-numbered word lines and the odd-numbered data lines and intersecting points of the even-numbered word lines and the even-numbered data lines. Further, the sense amplifier circuits SAC and the state detecting circuits ALLC are arranged for every pair of adjacent data lines, and each of the adjacent data lines is used as a reference dummy data line.

As described above, the present invention has such a remarkable effect that it is possible to detect the states of the memory cells for performing electrical reprogramming operation, i.e., erase operation and programming operation by means of all data lines automatically at the same time, and to perform control on insufficient erase, continuation and suspension of programming and so on in the device only.

What is claimed is:

1. A semiconductor nonvolatile memory device comprising:
   a plurality of word lines;
   a plurality of data lines intersecting said plurality of word lines;
   a plurality of source lines intersecting said plurality of word lines;
   a plurality of nonvolatile semiconductor memory cells each of which including a control gate, a floating gate, and a source connected to one source line of said plurality of source lines and a drain connected to one data line of said plurality of data lines;
   a plurality of precharging circuits each connected to a data line of said plurality of data lines;
   a plurality of state detecting circuits each connected to a data line of said plurality of data lines; and
   a plurality of data hold circuits connected to each data line of said plurality of data lines; wherein in programming operation for loading data from the exterior in said plurality of memory cells,
   said plurality of data hold circuits store data applied to said memory device and also load said data applied to said memory device are programmed for a predetermined period of time to said plurality of memory cells connected to a selected word line of said plurality of word lines;
   after said selected word line is made unselected, said plurality of precharging circuits precharge said plurality of data lines to the voltage in accordance with the data held in said plurality of data hold circuits;
   data stored in said plurality of data hold circuits are reprogrammed according to the data programmed in said plurality of memory cells connected to reselected word line by reselecting said selected word line thereafter;
   said state detecting circuits compare the reprogrammed data stored in said plurality of data hold circuits; and
   when the reprogrammed data stored in said plurality of data hold circuits are different from each other, said reprogrammed data stored in said plurality of data hold circuits are reprogrammed again for a predetermined period of time in said plurality of memory cells connected to said reselected word line.

2. The semiconductor nonvolatile memory device according to claim 1, wherein each of said plurality of data hold circuits includes a flip-flop type differential circuit.

3. The semiconductor nonvolatile memory device according to claim 1, further comprising:
   an internal address signal generator for generating an address signal for selecting a data line by using selecting address signals for a selected word line while programming, erasing or reading.

4. The semiconductor nonvolatile memory device according to claim 1, wherein the voltage applied to each of said plurality of data hold circuits at time of programming is equal to the drain voltage of the memory cell in which programming is performed.

5. The semiconductor nonvolatile memory device according to claim from 1 further comprising a precharging circuit, said precharging circuit comprising:
   a first MOSFET in which a precharging signal is applied to a gate terminal and the terminal of either one of a source or a drain is connected to the data line;
   a second MOSFET in which the output terminal of said data hold circuit is connected to the gate and the terminal of either one of the source or the drain is connected to another terminal of the first MOSFET, and another terminal is connected to a voltage wiring for precharging; and
   a third MOSFET in which a data line gate signal is applied to the gate, one terminal is connected to the data line and another terminal is connected to the output terminal inside said data hold circuit.

6. The semiconductor nonvolatile memory device according to claim 5, wherein said precharging circuit supplies precharging voltage to the data line in accordance with the voltage accumulated in the data hold circuit at program-verify time in programming-verify operation.

7. The semiconductor nonvolatile memory device according to claim 5: wherein said precharging signal in said precharge control circuit is activated before a signal for selecting a word line is activated and inactivated before a signal for selecting said word line is inactivated at erase-verify time, programming-verify time and normal program verify time.

8. The semiconductor nonvolatile memory device according to claim 1, further comprising a control signal generator, in response to a signal for reprogramming applied to said memory device, transferring data applied to said memory device to a data hold circuit, simultaneously writing all of said data onto a sector, simultaneously verifying all of memory cells in said sector, simultaneously detecting states of all of stored data in said data hold circuits each corresponding to each of memory cells in said sector by using a data detector and repeating said writing, said verifying and said detecting until accumulated data in all of the data hold circuits and the data stored in memory cells in said sector match with each other.

9. The semiconductor nonvolatile memory device according to claim 8, further comprising a status register or a ready/busy pin for an output signal which indicates that reprogramming operation is being executed or the operation has been completed.

10. The semiconductor nonvolatile memory device according to claim 1, wherein stored data of said data hold circuits are reset in advance using a latch set signal at program-verify time and at erase-verify time.

11. The semiconductor nonvolatile memory device according to claim 1, wherein, after programming operation in electrical reprogramming, data line voltage is discharged or fixed to ground state using a data line discharge MOSFET connected to each of said data line.

12. The semiconductor nonvolatile memory device according to claim 1, wherein said memory array is divided into two or more blocks, and activation timing of various control signals used in said divided respective blocks differs from one another.

13. The semiconductor nonvolatile memory device according to claim 1, wherein each of said plurality of state detecting circuits includes a MOSFET, and the output from each of said plurality of data hold circuits is connected to a gate of a MOSFET of a corresponding one of said plurality of state detecting circuits.

14. The semiconductor nonvolatile memory device according to claim 1, wherein each of said plurality of state detecting circuits includes a MOSFET, and the output from each of said plurality of data hold circuits is connected to a gate of a MOSFET of a corresponding one of said plurality of state detecting circuits, and source terminals and drain terminals of MOSFETs of said plurality of state detecting circuits are connected in common, respectively.

15. A semiconductor nonvolatile memory device according to claim 1, wherein each of said plurality of state detecting circuits includes a MOSFET which is a nonvolatile memory cell, wherein the output of each of said plurality of data hold circuits is connected to a gate of a MOSFET of a corresponding one of said plurality of state detecting circuits, and wherein each nonvolatile memory cell of said plurality of state detecting circuits is programmable so as to neglect a defective memory cell.

16. A semiconductor nonvolatile memory device according to claim 14, wherein each MOSFET of said plurality of state detecting circuits is a nonvolatile memory cell, and wherein each nonvolatile memory cell of said plurality of state detecting circuits is programmable so as to neglect a defective memory cell.

* * * * *